United States Patent
Noyes et al.

(10) Patent No.: US 10,949,290 B2
(45) Date of Patent: *Mar. 16, 2021

(54) VALIDATION OF A SYMBOL RESPONSE MEMORY

(71) Applicant: Micron Technology, Inc., Boise, ID (US)

(72) Inventors: Harold B Noyes, Boise, ID (US); David R. Brown, Lucas, TX (US); Paul Glendenning, Woodside, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/547,241

(22) Filed: Aug. 21, 2019

(65) Prior Publication Data

US 2019/0377630 A1    Dec. 12, 2019

Related U.S. Application Data

(63) Continuation of application No. 16/030,479, filed on Jul. 9, 2018, now Pat. No. 10,402,265, which is a
(Continued)

(51) Int. Cl.
*G11C 29/00* (2006.01)
*G06F 11/10* (2006.01)
*H03M 13/09* (2006.01)

(52) U.S. Cl.
CPC ...... *G06F 11/1004* (2013.01); *G06F 11/1076* (2013.01); *H03M 13/09* (2013.01)

(58) Field of Classification Search
CPC .. G06F 11/1004; G06F 11/1076; H03M 13/09
See application file for complete search history.

(56) References Cited

U.S. PATENT DOCUMENTS 3,849,762 A    11/1974  Fujimoto et al.
3,921,136 A    11/1975  Bar-Lev
(Continued)

FOREIGN PATENT DOCUMENTS

EP    0476159 A1    3/1992
EP    0943995 A2    9/1999
(Continued)

OTHER PUBLICATIONS

Beesley, K. R.; Arabic Morphology Using Only Finite-State Operations; Xerox Research Centre Europe; pp. 50-57; 1998.
(Continued)

*Primary Examiner* — Samir W Rizk
(74) *Attorney, Agent, or Firm* — Fletcher Yoder, P.C.

(57) ABSTRACT

Configuration content of electronic devices used for data analysis may be altered due to bit failure or corruption, for example. Accordingly, in one embodiment, a device includes a plurality of blocks, each block of the plurality of blocks includes a plurality of rows, each row of the plurality of rows includes a plurality of configurable elements, each configurable element of the plurality of configurable elements includes a data analysis element including a memory component programmed with configuration data. The data analysis element is configured to analyze at least a portion of a data stream based on the configuration data and to output a result of the analysis. The device also includes an error detection engine (EDE) configured to perform integrity validation of the configuration data.

20 Claims, 14 Drawing Sheets

Related U.S. Application Data continuation of application No. 15/280,481, filed on Sep. 29, 2016, now Pat. No. 10,019,311.

(56) References Cited

U.S. PATENT DOCUMENTS

| | | |
|---|---|---|
| 4,011,547 A | 3/1977 | Kimmel |
| 4,014,000 A | 3/1977 | Uno et al. |
| 4,123,695 A | 10/1978 | Hale et al. |
| 4,153,897 A | 5/1979 | Yasuda et al. |
| 4,204,193 A | 5/1980 | Schroeder |
| 4,414,685 A | 11/1983 | Sternberg |
| 4,748,674 A | 5/1988 | Freeman |
| 5,014,327 A | 5/1991 | Potter et al. |
| 5,028,821 A | 7/1991 | Kaplinsky |
| 5,216,748 A | 6/1993 | Quenot et al. |
| 5,257,361 A | 10/1993 | Doi et al. |
| 5,287,523 A | 2/1994 | Allison et al. |
| 5,291,482 A | 3/1994 | McHarg et al. |
| 5,300,830 A | 4/1994 | Hawes |
| 5,331,227 A | 7/1994 | Hawes |
| 5,357,512 A | 10/1994 | Khaira et al. |
| 5,371,878 A | 12/1994 | Coker |
| 5,377,129 A | 12/1994 | Molvig et al. |
| 5,459,798 A | 10/1995 | Bailey et al. |
| 5,615,237 A | 3/1997 | Chang et al. |
| 5,659,551 A | 8/1997 | Huott et al. |
| 5,723,984 A | 3/1998 | Sharpe-Geisler |
| 5,754,878 A | 5/1998 | Asghar et al. |
| 5,790,531 A | 8/1998 | Ellebracht et al. |
| 5,881,312 A | 3/1999 | Dulong |
| 5,896,548 A | 4/1999 | Ofek |
| 5,956,741 A | 9/1999 | Jones |
| 6,011,407 A | 1/2000 | New |
| 6,016,361 A | 1/2000 | Hongu et al. |
| 6,034,963 A | 3/2000 | Minami et al. |
| 6,041,405 A | 3/2000 | Green |
| 6,052,766 A | 4/2000 | Betker et al. |
| 6,058,469 A | 5/2000 | Baxter |
| 6,151,644 A | 11/2000 | Wu |
| 6,240,003 B1 | 5/2001 | McElroy |
| 6,279,128 B1 | 8/2001 | Arnold et al. |
| 6,317,427 B1 | 11/2001 | Augusta et al. |
| 6,362,868 B1 | 3/2002 | Silverbrook |
| 6,400,996 B1 | 6/2002 | Hoffberg et al. |
| 6,606,699 B2 | 8/2003 | Pechanek et al. |
| 6,614,703 B2 | 9/2003 | Pitts et al. |
| 6,625,740 B1 | 9/2003 | Datar et al. |
| 6,633,443 B1 | 10/2003 | Watanabe et al. |
| 6,636,483 B1 | 10/2003 | Pannell |
| 6,640,262 B1 | 10/2003 | Uppunda et al. |
| 6,697,979 B1 | 2/2004 | Vorbach et al. |
| 6,700,404 B1 | 3/2004 | Feng et al. |
| 6,880,087 B1 | 4/2005 | Carter |
| 6,906,938 B2 | 6/2005 | Kaginele |
| 6,944,710 B2 | 9/2005 | Regev et al. |
| 6,977,897 B1 | 12/2005 | Nelson et al. |
| 7,010,639 B2 | 3/2006 | Larson et al. |
| 7,089,352 B2 | 8/2006 | Regev et al. |
| 7,146,643 B2 | 12/2006 | Dapp et al. |
| 7,176,717 B2 | 2/2007 | Sunkavalli et al. |
| 7,276,934 B1 | 10/2007 | Young |
| 7,305,047 B1 | 12/2007 | Turner |
| 7,358,761 B1 | 4/2008 | Sunkavalli et al. |
| 7,366,352 B2 | 4/2008 | Kravec et al. |
| 7,392,229 B2 | 6/2008 | Harris et al. |
| 7,428,722 B2 | 9/2008 | Sunkavalli et al. |
| 7,487,131 B2 | 2/2009 | Harris et al. |
| 7,487,542 B2 | 2/2009 | Boulanger et al. |
| 7,499,464 B2 | 3/2009 | Ayrapetian et al. |
| 7,725,510 B2 | 5/2010 | Alicherry et al. |
| 7,774,286 B1 | 8/2010 | Harris |
| 7,804,719 B1 | 9/2010 | Chirania et al. |
| 7,890,923 B2 | 2/2011 | Elaasar |
| 7,899,052 B1 | 3/2011 | Hao et al. |
| 7,917,684 B2 | 3/2011 | Noyes et al. |
| 7,970,964 B2 | 6/2011 | Noyes |
| 8,015,530 B1 | 9/2011 | Sinclair et al. |
| 8,020,131 B1 | 9/2011 | Van Mau et al. |
| 8,065,249 B1 | 11/2011 | Harris et al. |
| 8,140,780 B2 | 3/2012 | Noyes |
| 8,146,040 B1 | 3/2012 | Janneck et al. |
| 8,159,900 B2 | 4/2012 | Moore et al. |
| 8,209,521 B2 | 6/2012 | Noyes et al. |
| 8,239,660 B2 | 8/2012 | Cervini |
| 8,281,395 B2 | 10/2012 | Pawlowski |
| 8,294,490 B1 | 10/2012 | Kaviani |
| 8,402,188 B2 | 3/2013 | Noyes et al. |
| 8,536,896 B1 | 9/2013 | Trimberger |
| 8,593,175 B2 | 11/2013 | Noyes et al. |
| 8,648,621 B2 | 2/2014 | Noyes et al. |
| 8,680,888 B2 | 3/2014 | Brown et al. |
| 8,725,961 B2 | 5/2014 | Noyes |
| 8,782,624 B2 | 7/2014 | Brown et al. |
| 8,938,590 B2 | 1/2015 | Noyes et al. |
| 9,058,465 B2 | 6/2015 | Noyes et al. |
| 9,063,532 B2 | 6/2015 | Brown |
| 9,075,428 B2 | 7/2015 | Brown |
| 9,118,327 B2 | 8/2015 | Noyes et al. |
| 9,235,798 B2 | 1/2016 | Brown et al. |
| 2002/0186044 A1 | 12/2002 | Agrawal et al. |
| 2003/0107996 A1 | 6/2003 | Black et al. |
| 2003/0142698 A1 | 7/2003 | Parhi |
| 2003/0163615 A1 | 8/2003 | Yu |
| 2003/0226002 A1 | 12/2003 | Boutaud et al. |
| 2004/0100980 A1 | 5/2004 | Jacobs et al. |
| 2004/0125807 A1 | 7/2004 | Liu et al. |
| 2004/0151211 A1 | 8/2004 | Snider |
| 2004/0184662 A1 | 9/2004 | Kravec et al. |
| 2005/0154916 A1 | 7/2005 | Boulanger et al. |
| 2005/0251638 A1 | 11/2005 | Boutaud et al. |
| 2006/0158219 A1 | 7/2006 | Sunkavalli et al. |
| 2006/0195496 A1 | 8/2006 | Vadi et al. |
| 2006/0206875 A1 | 9/2006 | Ullmann et al. |
| 2006/0257043 A1 | 11/2006 | Chiu |
| 2006/0274001 A1 | 12/2006 | Guttag et al. |
| 2006/0288070 A1 | 12/2006 | Vadi et al. |
| 2007/0005869 A1 | 1/2007 | Balraj et al. |
| 2007/0075878 A1 | 4/2007 | Furodet et al. |
| 2007/0127482 A1 | 6/2007 | Harris et al. |
| 2007/0150623 A1 | 6/2007 | Kravec et al. |
| 2007/0282833 A1 | 12/2007 | McMillen |
| 2007/0283108 A1 | 12/2007 | Isherwood et al. |
| 2008/0126690 A1 | 5/2008 | Rajan et al. |
| 2008/0129334 A1 | 6/2008 | Sunkavalli et al. |
| 2008/0133874 A1 | 6/2008 | Capek et al. |
| 2008/0140661 A1 | 6/2008 | Pandya |
| 2008/0178031 A1 | 7/2008 | Dong-Han |
| 2008/0256347 A1 | 10/2008 | Eickemeyer et al. |
| 2008/0320053 A1 | 12/2008 | Iijima et al. |
| 2009/0198952 A1 | 8/2009 | Khmelnitsky et al. |
| 2009/0204734 A1 | 8/2009 | Strait et al. |
| 2010/0100691 A1 | 4/2010 | Noyes et al. |
| 2010/0100714 A1 | 4/2010 | Noyes et al. |
| 2010/0115173 A1 | 5/2010 | Noyes et al. |
| 2010/0115347 A1 | 5/2010 | Noyes |
| 2010/0118425 A1 | 5/2010 | Rafaelof |
| 2010/0138432 A1 | 6/2010 | Noyes |
| 2010/0138575 A1 | 6/2010 | Noyes |
| 2010/0138634 A1 | 6/2010 | Noyes |
| 2010/0138635 A1 | 6/2010 | Noyes |
| 2010/0145182 A1 | 6/2010 | Schmidt et al. |
| 2010/0174887 A1 | 7/2010 | Pawlowski |
| 2010/0174929 A1 | 7/2010 | Pawlowski |
| 2010/0175130 A1 | 7/2010 | Pawlowski |
| 2010/0185647 A1 | 7/2010 | Noyes |
| 2010/0325352 A1 | 12/2010 | Schuette et al. |
| 2010/0332809 A1 | 12/2010 | Noyes et al. |
| 2011/0004578 A1 | 1/2011 | Momma et al. |
| 2011/0145182 A1 | 6/2011 | Dlugosch et al. |
| 2011/0145271 A1 | 6/2011 | Noyes et al. |
| 2011/0145544 A1 | 6/2011 | Noyes et al. |
| 2011/0161620 A1 | 6/2011 | Kaminski et al. |
| 2011/0208900 A1 | 8/2011 | Schuette et al. |
| 2011/0258360 A1 | 10/2011 | Noyes |

(56) References Cited

U.S. PATENT DOCUMENTS

| | | |
|---|---|---|
| 2011/0307233 A1 | 12/2011 | Tseng et al. |
| 2011/0307433 A1 | 12/2011 | Dlugosch |
| 2011/0307503 A1 | 12/2011 | Dlugosch |
| 2011/0320759 A1 | 12/2011 | Craddock et al. |
| 2012/0179854 A1 | 7/2012 | Noyes |
| 2012/0192163 A1 | 7/2012 | Glendenning et al. |
| 2012/0192164 A1 | 7/2012 | Xu et al. |
| 2012/0192165 A1 | 7/2012 | Xu et al. |
| 2012/0192166 A1 | 7/2012 | Xu et al. |
| 2013/0154685 A1 | 6/2013 | Noyes |
| 2013/0156043 A1 | 6/2013 | Brown et al. |
| 2013/0159239 A1 | 6/2013 | Brown et al. |
| 2013/0159670 A1 | 6/2013 | Noyes |
| 2013/0159671 A1 | 6/2013 | Brown et al. |
| 2013/0275709 A1 | 10/2013 | Gajapathy |
| 2014/0025614 A1 | 1/2014 | Noyes et al. |
| 2014/0025923 A1 | 1/2014 | Klein |
| 2014/0067736 A1 | 3/2014 | Noyes |
| 2014/0204956 A1 | 7/2014 | Brown et al. |
| 2014/0225889 A1 | 8/2014 | Kim et al. |
| 2014/0279776 A1 | 9/2014 | Brown et al. |
| 2014/0325494 A1 | 10/2014 | Brown et al. |

FOREIGN PATENT DOCUMENTS

| | | |
|---|---|---|
| JP | 08087462 A | 4/1996 |
| JP | 10069459 A | 3/1998 |
| JP | 10111862 A | 4/1998 |
| JP | 2000231549 A | 8/2000 |
| JP | 2000347708 A | 12/2000 |
| KR | 1020080097573 A | 11/2008 |
| WO | WO0065425 A1 | 11/2000 |
| WO | WO0138978 A1 | 5/2001 |
| WO | WO03039001 A1 | 5/2003 |
| WO | WO2005036750 A1 | 4/2005 |
| WO | WO2011114120 A1 | 9/2011 |

OTHER PUBLICATIONS

Bird, S. et al.; One-Level Phonology: Autosegmental Representations and Rules as Finite Automata; Association for Computational Linguistics; University of Edinburgh; vol. 20; No. 1; pp. 55-90; 1994.

Bispo, J. et al.; Regular Expression Matching for Reconfigurable Packet Inspection; IEEE International Conference on Field Programmable Technology; 2006.

Bispo, J. et al.; Synthesis of Regular Expressions Targeting FPGAs: Current Status and Open Issues; IST/INESC-ID, Libson, Portugal; pp. 1-12; 2007.

Brodie, B. et al.; A scalable Architecture for High-Throughput Regular-Expression Pattern Matching; Exegy Inc.; pp. 1-12; 2006.

Clark, C.; Design of Efficient FPGA Circuits for Matching Complex Patterns in Network Intrusion Detection Systems (Master of Science Thesis); Georgia Institute of Technology; pp. 1-56; Dec. 2003.

Clark, C.; A Unified Model of Pattern-Matching Circuits for Field-Programmable Gate Arrays [Doctoral Dissertation]; Georgia Institute of Technology; pp. 1-177; 2006.

Clark, C. et al.; Scalable Pattern Matching for High Speed Networks; Proceedings of the 12th Annual IEEE symposium on Field-Programmable Custom Computing Machines (FCCM'04);Georgia Institute of Technology; pp. 1-9; 2004.

Clark, C. et al.; A Unified Model of Pattern-Matching Circuit Architectures; Tech Report GIT-CERCS-05-20;Georgia Institute of Technology; pp. 1-17; 2005.

Fide, S.; String Processing in Hardware; Scalable Parallel and Distributed Systems Lab; Proceedings of the 12th Annual IEEE symposium on Field-Programmable Custom Computing Machines (FCCM'04); School of Electrical and Computer Engineering; Georgia Institute of Technology; pp. 1-9; 2004.

Fisk, M. et al.; Applying Fast String Matching to Intrusion Detection; Los Alamos National Laboratory; University of California San Diego; pp. 1-21; 2002.

Korenek, J.; Traffic Scanner—Hardware Accelerated Intrusion Detection System; http://www.liberouter.org/ ; 2006.

Kumar, S. et al.; Curing Regular Expressions matching Algorithms from Insomnia, Amnesia, and Acaluia; Department of Computer Science and Engineering; Washington University in St. Louis; pp. 1-17; Apr. 27, 2007.

Lipovski, G.; Dynamic Systolic Associative Memory Chip; IEEE; Department of Electrical and Computer Engineering; University of Texas at Austin; pp. 481-492; 1990.

Lin, C. et al.; Optimization of Pattern Matching Circuits for Regular Expression on FPGA; IEEE Transactions on Very Large Scale Integrations Systems; vol. 15, No. 12, pp. 1-6; Dec. 2007.

Schultz, K. et al.; Fully Parallel Integrated CAM/RAM Using Preclassification to Enable Large Capacities; IEEE Journal on Solid-State Circuits; vol. 31; No. 5; pp. 689-699; May 1996.

Shafai, F. et al.; Fully Parallel 30-MHz, 2.5-Mb CAM; IEEE Journal of Solid-State Circuits, vol. 33; No. 11; pp. 1690-1696; Nov. 1998.

Sidhu, R. et al.; Fast Regular Expression Pattern Matching using FPGAs; Department of EE-Systems; University of Southern California; pp. 1-12; 2001.

Wada, T.; Multiobject Behavior Recognition Event Driven Selective Attention Method; IEEE; pp. 1-16; 2000.

Yu, F.; High Speed Deep Packet Inspection with Hardware Support; Electrical Engineering and Computer Sciences; University of California at Berkeley; pp. 1-217; Nov. 22, 2006.

Freescale and Kaspersky ® Accelerated Antivirus Solution Platform for OEM Vendors; Freescale Semiconductors Document; pp. 1-16; 2007.

PCT/US2009/067534 International Search Report and Written Opinion dated Apr. 26, 2010.

PCT/US2009/061649 International Search Report dated Feb. 15, 2010.

Taiwan Application No. 098144804 Office Action dated Nov. 4, 2013.

PCT/US2012/067992 International Search Report dated Mar. 28, 2013.

PCT/US2012/068011 International Search Report dated Apr. 15, 2013.

PCT/US2012/067999 International Search Report dated May 14, 2013.

PCT/US2012/067995 International Search Report dated May 17, 2013.

PCT/US2012/067988 International Search Report (Partial) dated Jun. 24, 2014.

PCT/US2013/049744 International Search Report and Written Opinion dated Oct. 22, 2013.

PCT/US2013/049748 International Search Report and Written Opinion dated Oct. 22, 2013.

PCT/US2013/049755 International Search Report and Written Opinion dated Oct. 24, 2013.

PCT/US2013/049753 International Search Report and Written Opinion dated Nov. 7, 2013.

PCT/US2013/055434 International Search Report and Written Opinion dated Nov. 29, 2013.

PCT/US2013/055438 International Search Report and Written Opinion dated Nov. 29, 2013.

PCT/US2013/055436 International Search Report and Written Opinion dated Dec. 9, 2013.

PCT/US2014/023589 International Search Report and Written Opinion dated Jul. 24, 2014.

Soewito et al., "Self-Addressable Memory-Based FSM: A scalable Intrusion Detection Engine", IEEE Network, pp. 14-21; Feb. 2009.

Hurson A. R.; A VLSI Design for the Parallel Finite State Automation and Its Performance Evaluation as a Hardware Scanner; International Journal of Computer and Information Sciences, vol. 13, No. 6; 1984.

Carpenter et al., "A Massively Parallel Architecture for a Self-Organizing Neural Pattern Recognition Machine", Academic Press, Inc.; 1987.

Cong et al., "Application-Specific Instruction Generation for Configurable Processor Architectures", Computer Science Department, University of California, ACM; 2004.

(56) References Cited

OTHER PUBLICATIONS

Glette et al., "An Online EHW Pattern Recognition System Applied to Face Image Recognition", University of Oslo, Norway; 2007.
Kawai et al., "An Adaptive Pattern Recognition Hardware with On-chip Shift Register-based Partial Reconfiguration", IEEE; 2008.
Kutrib et al., "Massively Parallel Pattern Recognition with Link Features", IFIG Research Report 0003; 2000.
Marculescu et al., Power Management of Multi-Core Systems: Challenges, Approaches, and Recent Developments Tutorial at ASPLOS, London, UK [online]; Mar. 4, 2012.
Vitanen et al ; Image Pattern Recognition Using Configurable Logic Cell Array; New Advances in Computer Graphics; pp. 355-368; 1989.
Yasunaga et al., "Kernel-based Pattern Recognition Hardware: Its Design Methodology Using Evolved Truth Tables", IEEE, 2000.
U.S. Appl. No. 60/652,738, filed Feb. 12, 2005, Harris.
U.S. Appl. No. 61/788,364, filed Mar. 15, 2013, Brown et al.

VALIDATION OF A SYMBOL RESPONSE MEMORY

CROSS-REFERENCE TO RELATED APPLICATIONS

The present application is a continuation of U.S. application Ser. No. 16/030,479, entitled "Validation of a Symbol Response Memory," and filed Jul. 9, 2018, now U.S. Ser. No. 10/402,265 which issued on Sep. 3, 2019, which is a continuation of U.S. application Ser. No. 15/280,481, entitled "Validation of a Symbol Response Memory," and filed Sep. 29, 2016, now U.S. Pat. No. 10,019,311 which issued on Jul. 10, 2018, the entirety of which is incorporated by reference herein for all purposes.

BACKGROUND

Field of Invention

Embodiments of the invention relate generally to electronic devices and, more specifically, in certain embodiments, to validation of configuration content stored in electronic devices used for data analysis.

Description of Related Art

Complex pattern recognition can be inefficient to perform on a conventional von Neumann based computer. A biological brain, in particular a human brain, however, is adept at performing pattern recognition. Current research suggests that a human brain performs pattern recognition using a series of hierarchically organized neuron layers in the neocortex. Neurons in the lower layers of the hierarchy analyze "raw signals" from, for example, sensory organs, while neurons in higher layers analyze signal outputs from neurons in the lower levels. This hierarchical system in the neocortex, possibly in combination with other areas of the brain, accomplishes the complex pattern recognition that enables humans to perform high level functions such as spatial reasoning, conscious thought, and complex language.

In the field of computing, pattern recognition tasks are increasingly challenging. Ever larger volumes of data are transmitted between computers, and the number of patterns that users wish to identify is increasing. For example, spam or malware are often detected by searching for patterns in a data stream, e.g., particular phrases or pieces of code. The number of patterns increases with the variety of spam and malware, as new patterns may be implemented to search for new variants. Searching a data stream for each of these patterns can form a computing bottleneck. Often, as the data stream is received, it is searched for each pattern, one at a time. The delay before the system is ready to search the next portion of the data stream increases with the number of patterns. Thus, pattern recognition may slow the receipt of data.

Hardware has been designed to search a data stream for patterns, but this hardware often is unable to process adequate amounts of data in an amount of time given. Some devices configured to search a data stream do so by distributing the data stream among a plurality of circuits. The circuits each determine whether the data stream matches a portion of a pattern. Often, a large number of circuits operate in parallel, each searching the data stream at generally the same time. The system may then further process the results from these circuits, to arrive at the final results. These "intermediate results", however, can be larger than the original input data, which may pose issues for the system. The ability to use a cascaded circuits approach, similar to the human brain, offers one potential solution to this problem. However, there has not been a system that effectively allows for performing pattern recognition in a manner more comparable to that of a biological brain. In addition, configuration content of electronic devices used for data analysis in some systems may be altered due to bit failure or corruption. Development of a system that performs pattern recognition comparable to the biological brain and that validates configuration content is desirable.

BRIEF DESCRIPTION OF DRAWINGS

FIG. 13 illustrates a second example of a state machine engine including an error detection engine (EDE), according to various embodiments.

DETAILED DESCRIPTION

Figure 1:
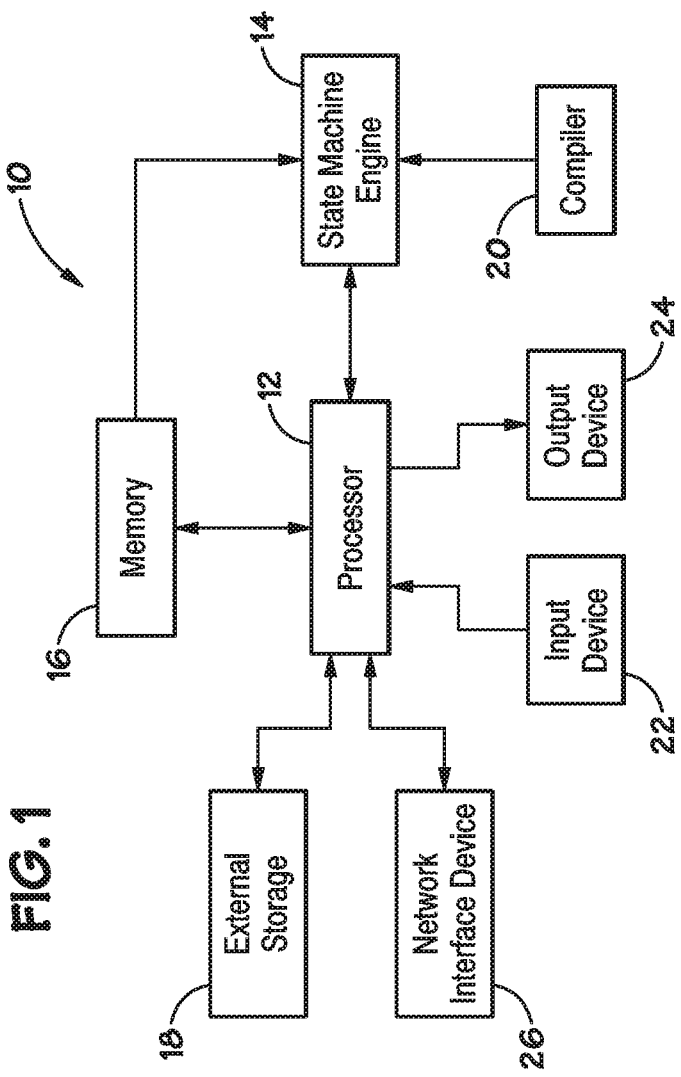
FIG. 1 illustrates an example of system having a state machine engine, according to various embodiments.

Turning now to the figures, FIG. 1 illustrates an embodiment of a processor-based system, generally designated by reference numeral 10. The system 10 may be any of a variety of types such as a desktop computer, laptop computer, pager, cellular phone, personal organizer, portable audio player, control circuit, camera, etc. The system 10 may also be a network node, such as a router, a server, or a client (e.g., one of the previously-described types of computers). The system 10 may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

In a typical processor-based device, such as the system 10, a processor 12, such as a microprocessor, controls the processing of system functions and requests in the system 10. Further, the processor 12 may comprise a plurality of processors that share system control. The processor 12 may be coupled directly or indirectly to each of the elements in the system 10, such that the processor 12 controls the system 10 by executing instructions that may be stored within the system 10 or external to the system 10.

In accordance with the embodiments described herein, the system 10 includes a state machine engine 14, which may operate under control of the processor 12. The state machine engine 14 may employ any one of a number of state machine architectures, including, but not limited to Mealy architectures, Moore architectures, Finite State Machines (FSMs), Deterministic FSMs (DFSMs), Bit-Parallel State Machines (BPSMs), etc. Though a variety of architectures may be used, for discussion purposes, the application refers to FSMs. However, those skilled in the art will appreciate that the described techniques may be employed using any one of a variety of state machine architectures.

As discussed further below, the state machine engine 14 may include a number of (e.g., one or more) finite state machine (FSM) lattices (e.g., core of a chip). For purposes of this application the term "lattice" refers to an organized framework (e.g., routing matrix, routing network, frame) of elements (e.g., Boolean cells, counter cells, state machine elements, state transition elements). Furthermore, the "lattice" may have any suitable shape, structure, or hierarchical organization (e.g., grid, cube, spherical, cascading). Each FSM lattice may implement multiple FSMs that each receive and analyze the same data in parallel. Further, the FSM lattices may be arranged in groups (e.g., clusters), such that clusters of FSM lattices may analyze the same input data in parallel. Further, clusters of FSM lattices of the state machine engine 14 may be arranged in a hierarchical structure wherein outputs from state machine lattices on a lower level of the hierarchical structure may be used as inputs to state machine lattices on a higher level. By cascading clusters of parallel FSM lattices of the state machine engine 14 in series through the hierarchical structure, increasingly complex patterns may be analyzed (e.g., evaluated, searched, etc.).

Further, based on the hierarchical parallel configuration of the state machine engine 14, the state machine engine 14 can be employed for complex data analysis (e.g., pattern recognition or other processing) in systems that utilize high processing speeds. For instance, embodiments described herein may be incorporated in systems with processing speeds of 1 GByte/sec. Accordingly, utilizing the state machine engine 14, data from high speed memory devices or other external devices may be rapidly analyzed. The state machine engine 14 may analyze a data stream according to several criteria (e.g., search terms), at about the same time, e.g., during a single device cycle. Each of the FSM lattices within a cluster of FSMs on a level of the state machine engine 14 may each receive the same search term from the data stream at about the same time, and each of the parallel FSM lattices may determine whether the term advances the state machine engine 14 to the next state in the processing criterion. The state machine engine 14 may analyze terms according to a relatively large number of criteria, e.g., more than 100, more than 110, or more than 10,000. Because they operate in parallel, they may apply the criteria to a data stream having a relatively high bandwidth, e.g., a data stream of greater than or generally equal to 1 GByte/sec, without slowing the data stream.

In one embodiment, the state machine engine 14 may be configured to recognize (e.g., detect) a great number of patterns in a data stream. For instance, the state machine engine 14 may be utilized to detect a pattern in one or more of a variety of types of data streams that a user or other entity might wish to analyze. For example, the state machine engine 14 may be configured to analyze a stream of data received over a network, such as packets received over the Internet or voice or data received over a cellular network. In one example, the state machine engine 14 may be configured to analyze a data stream for spam or malware. The data stream may be received as a serial data stream, in which the data is received in an order that has meaning, such as in a temporally, lexically, or semantically significant order. Alternatively, the data stream may be received in parallel or out of order and, then, converted into a serial data stream, e.g., by reordering packets received over the Internet. In some embodiments, the data stream may present terms serially, but the bits expressing each of the terms may be received in parallel. The data stream may be received from a source external to the system 10, or may be formed by interrogating a memory device, such as the memory 16, and forming the data stream from data stored in the memory 16. In other examples, the state machine engine 14 may be configured to recognize a sequence of characters that spell a certain word, a sequence of genetic base pairs that specify a gene, a sequence of bits in a picture or video file that form a portion of an image, a sequence of bits in an executable file that form a part of a program, or a sequence of bits in an audio file that form a part of a song or a spoken phrase. The stream of data to be analyzed may include multiple bits of data in a binary format or other formats, e.g., base ten, ASCII, etc. The stream may encode the data with a single digit or multiple digits, e.g., several binary digits.

As will be appreciated, the system 10 may include memory 16. The memory 16 may include volatile memory, such as Dynamic Random Access Memory (DRAM), Static Random Access Memory (SRAM), Synchronous DRAM (SDRAM), Double Data Rate DRAM (DDR SDRAM), DDR2 SDRAM, DDR3 SDRAM, etc. The memory 16 may also include non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) to be used in conjunction with the volatile memory. The memory 16 may include one or more memory devices, such as DRAM devices, that may provide data to be analyzed by the state machine engine 14. As used herein, the term "provide" may generically refer to direct, input, insert, issue, route, send, transfer, transmit, generate, give, make available, move, output, pass, place, read out, write, etc. Such devices may be referred to as or include solid state drives (SSD's), Multi-MediaCards (MMC's), SecureDigital (SD) cards, Compact-Flash (CF) cards, or any other suitable device. Further, it should be appreciated that such devices may couple to the system 10 via any suitable interface, such as Universal Serial Bus (USB), Peripheral Component Interconnect (PCI), PCI Express (PCI-E), Small Computer System Interface (SCSI), IEEE 1394 (Firewire), or any other suitable interface. To facilitate operation of the memory 16, such as the flash memory devices, the system 10 may include a memory controller (not illustrated). As will be appreciated, the memory controller may be an independent device or it may be integral with the processor 12. Additionally, the system 10 may include an external storage 18, such as a magnetic storage device. The external storage may also provide input data to the state machine engine 14.

The system 10 may include a number of additional elements. For instance, a compiler 20 may be used to configure (e.g., program) the state machine engine 14, as described in more detail with regard to FIG. 8. An input device 22 may also be coupled to the processor 12 to allow a user to input data into the system 10. For instance, an input device 22 may be used to input data into the memory 16 for later analysis by the state machine engine 14. The input device 22 may include buttons, switching elements, a keyboard, a light pen, a stylus, a mouse, and/or a voice recognition system, for instance. An output device 24, such as a display may also be coupled to the processor 12. The display 24 may include an LCD, a CRT, LEDs, and/or an audio display, for example. They system may also include a network interface device 26, such as a Network Interface Card (NIC), for interfacing with a network, such as the Internet. As will be appreciated, the system 10 may include many other components, depending on the application of the system 10.

FIGS. 2-5 illustrate an example of a FSM lattice 30. In an example, the FSM lattice 30 comprises an array of blocks 32. As will be described, each block 32 may include a plurality of selectively couple-able hardware elements (e.g., configurable elements and/or special purpose elements) that correspond to a plurality of states in a FSM. Similar to a state in a FSM, a hardware element can analyze an input stream and activate a downstream hardware element, based on the input stream.

The configurable elements can be configured (e.g., programmed) to implement many different functions. For instance, the configurable elements may include state transition elements (STEs) 34, 36 (shown in FIG. 5) that function as data analysis elements and are hierarchically organized into rows 38 (shown in FIGS. 3 and 4) and blocks 32 (shown in FIGS. 2 and 3). The STEs each may be considered an automaton, e.g., a machine or control mechanism designed to follow automatically a predetermined sequence of operations or respond to encoded instructions. Taken together, the STEs form an automata processor as state machine engine 14. To route signals between the hierarchically organized STEs 34, 36, a hierarchy of configurable switching elements can be used, including inter-block switching elements 40 (shown in FIGS. 2 and 3), intra-block switching elements 42 (shown in FIGS. 3 and 4) and intra-row switching elements 44 (shown in FIG. 4).

As described below, the switching elements may include routing structures and buffers. A STE 34, 36 can correspond to a state of a FSM implemented by the FSM lattice 30. The STEs 34, 36 can be coupled together by using the configurable switching elements as described below. Accordingly, a FSM can be implemented on the FSM lattice 30 by configuring the STEs 34, 36 to correspond to the functions of states and by selectively coupling together the STEs 34, 36 to correspond to the transitions between states in the FSM.

Figure 2:
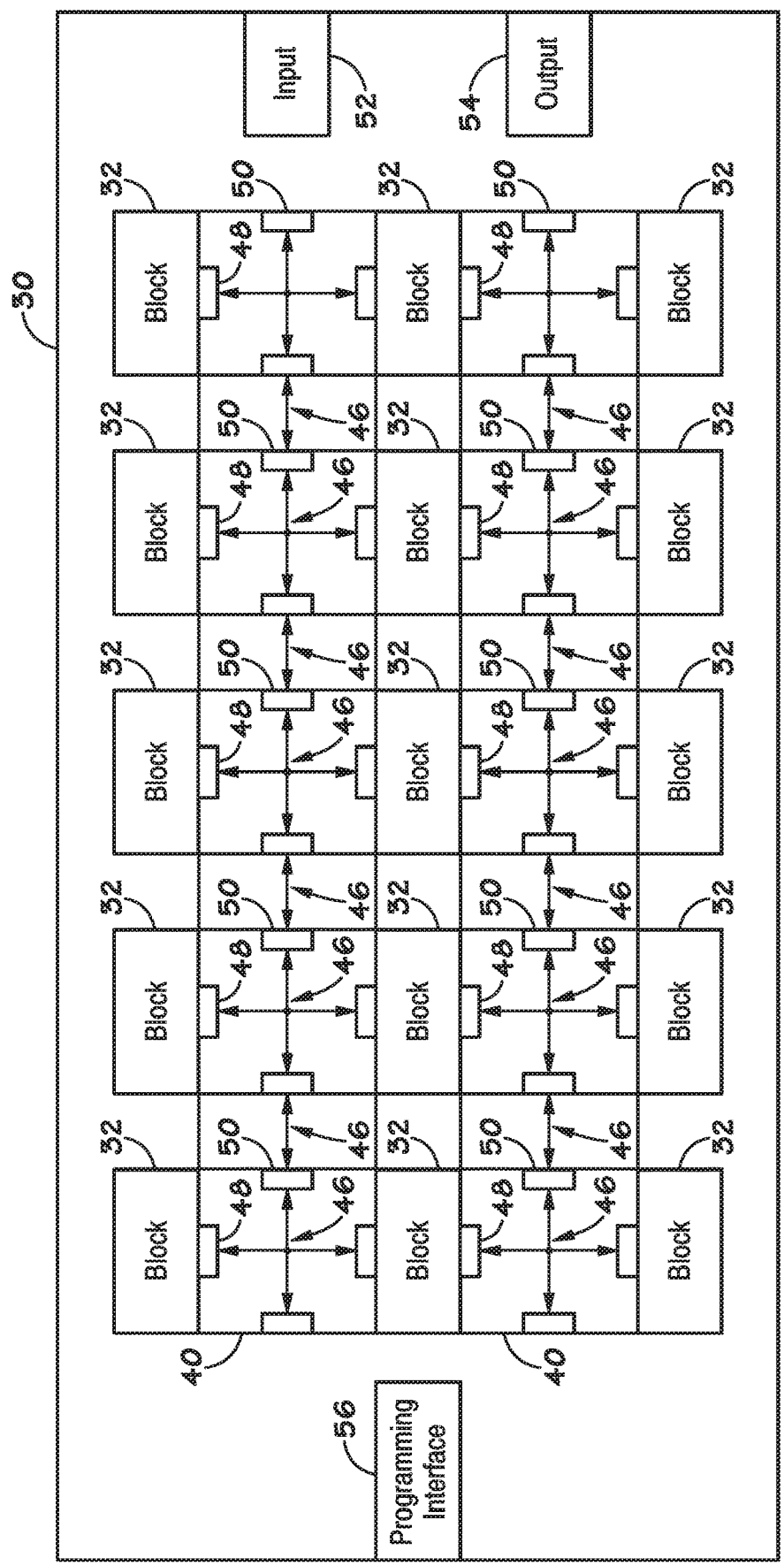
FIG. 2 illustrates an example of an FSM lattice of the state machine engine of FIG. 1, according to various embodiments.

FIG. 2 illustrates an overall view of an example of a FSM lattice 30. The FSM lattice 30 includes a plurality of blocks 32 that can be selectively coupled together with configurable inter-block switching elements 40. The inter-block switching elements 40 may include conductors 46 (e.g., wires, traces, etc.) and buffers 48, 50. In an example, buffers 48 and 50 are included to control the connection and timing of signals to/from the inter-block switching elements 40. As described further below, the buffers 48 may be provided to buffer data being sent between blocks 32, while the buffers 50 may be provided to buffer data being sent between inter-block switching elements 40. Additionally, the blocks 32 can be selectively coupled to an input block 52 (e.g., a data input port) for receiving signals (e.g., data) and providing the data to the blocks 32. The blocks 32 can also be selectively coupled to an output block 54 (e.g., an output port) for providing signals from the blocks 32 to an external device (e.g., another FSM lattice 30). The FSM lattice 30 can also include a programming interface 56 to configure (e.g., via an image, program) the FSM lattice 30. The image can configure (e.g., set) the state of the STEs 34, 36. For example, the image can configure the STEs 34, 36 to react in a certain way to a given input at the input block 52. For example, a STE 34, 36 can be set to output a high signal when the character 'a' is received at the input block 52.

In an example, the input block 52, the output block 54, and/or the programming interface 56 can be implemented as registers such that writing to or reading from the registers provides data to or from the respective elements. Accordingly, bits from the image stored in the registers corresponding to the programming interface 56 can be loaded on the STEs 34, 36. Although FIG. 2 illustrates a certain number of conductors (e.g., wire, trace) between a block 32, input block 52, output block 54, and an inter-block switching element 40, it should be understood that in other examples, fewer or more conductors may be used.

Figure 3:
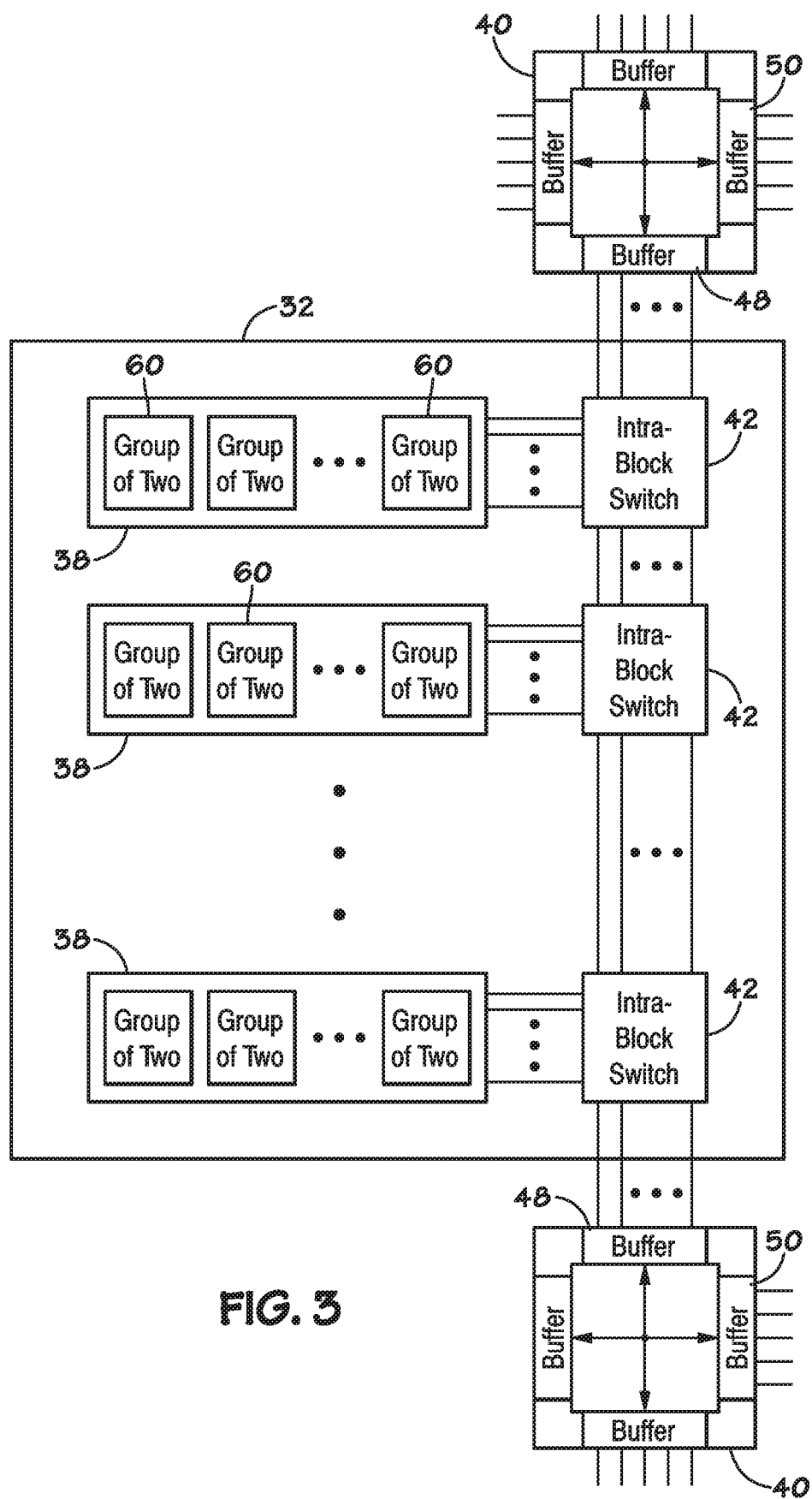
FIG. 3 illustrates an example of a block of the FSM lattice of FIG. 2, according to various embodiments.

FIG. 3 illustrates an example of a block 32. A block 32 can include a plurality of rows 38 that can be selectively coupled together with configurable intra-block switching elements 42. Additionally, a row 38 can be selectively coupled to another row 38 within another block 32 with the inter-block switching elements 40. A row 38 includes a plurality of STEs 34, 36 organized into pairs of configurable elements that are referred to herein as groups of two (GOTs) 60. In an example, a block 32 comprises sixteen (16) rows 38.

Figure 4:
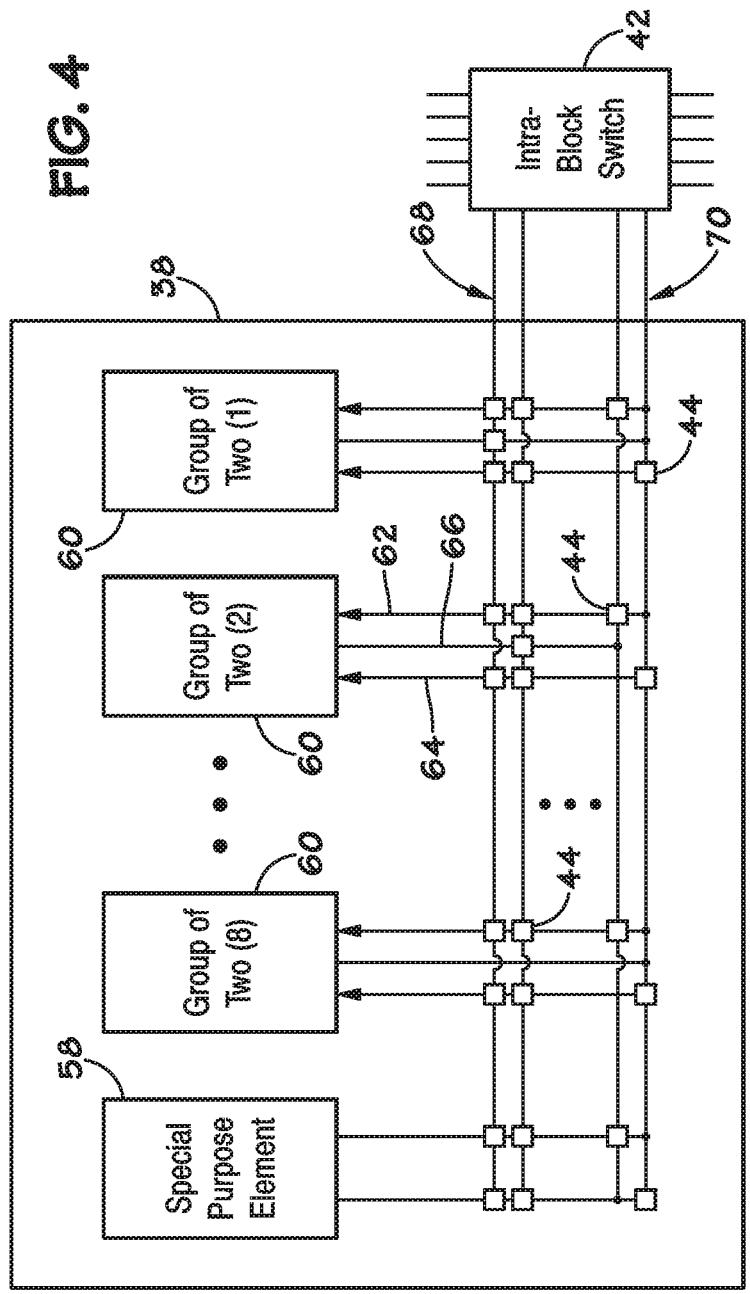
FIG. 4 illustrates an example of a row of the block of FIG. 3, according to various embodiments.

FIG. 4 illustrates an example of a row 38. A GOT 60 can be selectively coupled to other GOTs 60 and any other elements (e.g., a special purpose element 58) within the row 38 by configurable intra-row switching elements 44. A GOT 60 can also be coupled to other GOTs 60 in other rows 38 with the intra-block switching element 42, or other GOTs 60 in other blocks 32 with an inter-block switching element 40. In an example, a GOT 60 has a first and second input 62, 64, and an output 66. The first input 62 is coupled to a first STE 34 of the GOT 60 and the second input 64 is coupled to a second STE 36 of the GOT 60, as will be further illustrated with reference to FIG. 5.

In an example, the row 38 includes a first and second plurality of row interconnection conductors 68, 70. In an example, an input 62, 64 of a GOT 60 can be coupled to one or more row interconnection conductors 68, 70, and an output 66 can be coupled to one or more row interconnection conductor 68, 70. In an example, a first plurality of the row interconnection conductors 68 can be coupled to each STE 34, 36 of each GOT 60 within the row 38. A second plurality of the row interconnection conductors 70 can be coupled to only one STE 34, 36 of each GOT 60 within the row 38, but cannot be coupled to the other STE 34, 36 of the GOT 60. In an example, a first half of the second plurality of row interconnection conductors 70 can couple to first half of the STEs 34, 36 within a row 38 (one STE 34 from each GOT 60) and a second half of the second plurality of row interconnection conductors 70 can couple to a second half of the STEs 34, 36 within a row 38 (the other STE 34, 36 from each GOT 60), as will be better illustrated with respect to FIG. 5. The limited connectivity between the second plurality of row interconnection conductors 70 and the STEs 34, 36 is referred to herein as "parity". In an example, the row 38 can also include a special purpose element 58 such as a counter, a configurable Boolean logic element, look-up table, RAM, a field configurable gate array (FPGA), an application specific integrated circuit (ASIC), a configurable processor (e.g., a microprocessor), or other element for performing a special purpose function.

In an example, the special purpose element 58 comprises a counter (also referred to herein as counter 58). In an example, the counter 58 comprises a 12-bit configurable down counter. The 12-bit configurable counter 58 has a counting input, a reset input, and zero-count output. The counting input, when asserted, decrements the value of the counter 58 by one. The reset input, when asserted, causes the counter 58 to load an initial value from an associated register. For the 12-bit counter 58, up to a 12-bit number can be loaded in as the initial value. When the value of the counter 58 is decremented to zero (0), the zero-count output is asserted. The counter 58 also has at least two modes, pulse and hold. When the counter 58 is set to pulse mode, the zero-count output is asserted when the counter 58 reaches zero. For example, the zero-count output is asserted during the processing of an immediately subsequent next data byte, which results in the counter 58 being offset in time with respect to the input character cycle. After the next character cycle, the zero-count output is no longer asserted. In this manner, for example, in the pulse mode, the zero-count output is asserted for one input character processing cycle. When the counter 58 is set to hold mode the zero-count output is asserted during the clock cycle when the counter 58 decrements to zero, and stays asserted until the counter 58 is reset by the reset input being asserted.

In another example, the special purpose element 58 comprises Boolean logic. For example, the Boolean logic may be used to perform logical functions, such as AND, OR, NAND, NOR, Sum of Products (SoP), Negated-Output Sum of Products (NSoP), Negated-Output Product of Sum (NPoS), and Product of Sums (PoS) functions. This Boolean logic can be used to extract data from terminal state STEs (corresponding to terminal nodes of a FSM, as discussed later herein) in FSM lattice 30. The data extracted can be used to provide state data to other FSM lattices 30 and/or to provide configuring data used to reconfigure FSM lattice 30, or to reconfigure another FSM lattice 30.

Figure 4A:
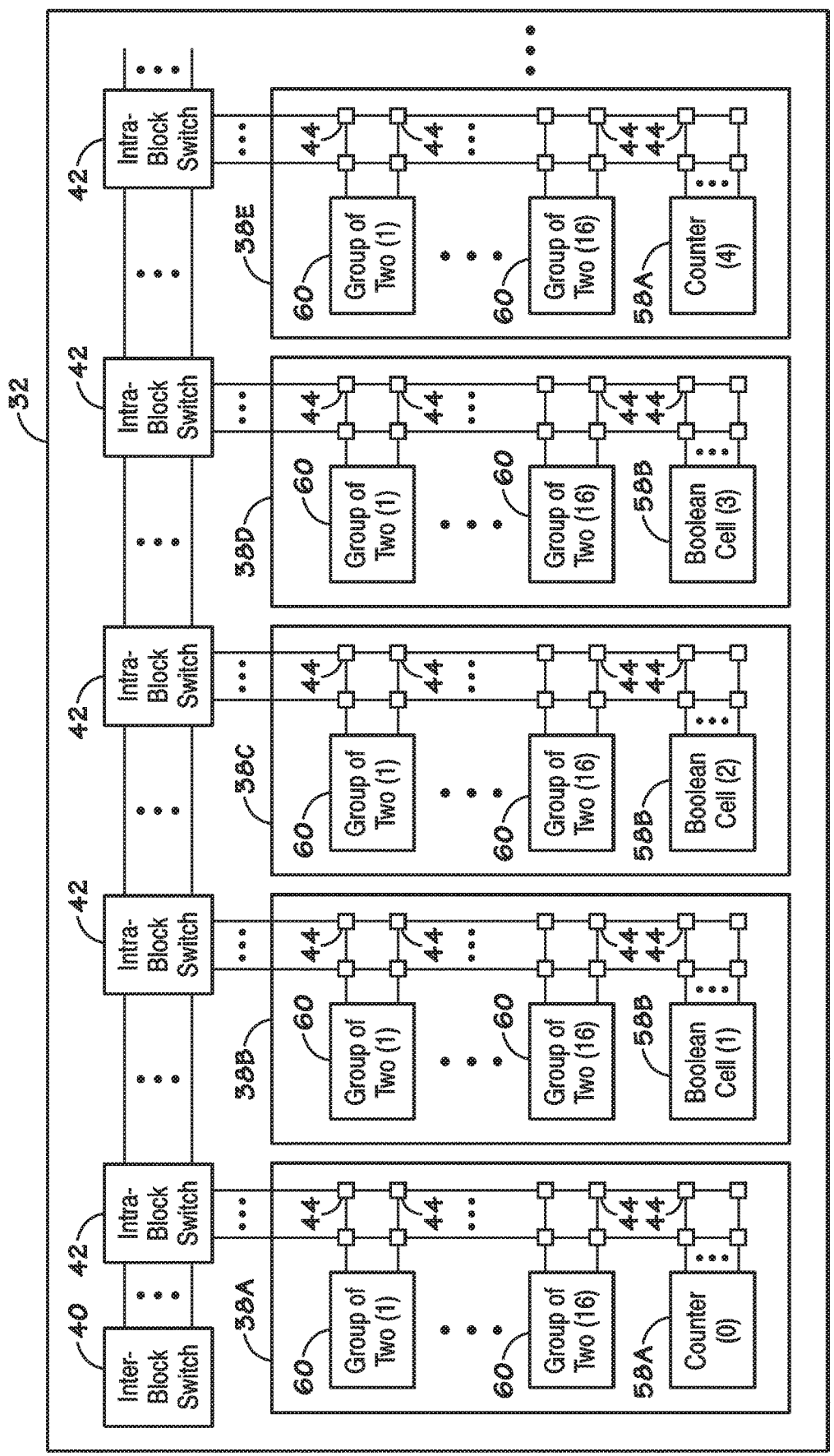
FIG. 4A illustrates a block as in FIG. 3 having counters in rows of the block, according to various embodiments of the invention.

FIG. 4A is an illustration of an example of a block 32 having rows 38 which each include the special purpose element 58. For example, the special purpose elements 58 in the block 32 may include counter cells 58A and Boolean logic cells 58B. While only the rows 38 in row positions 0 through 4 are illustrated in FIG. 4A (e.g., labeled 38A through 38E), each block 32 may have any number of rows 38 (e.g., 16 rows 38), and one or more special purpose elements 58 may be configured in each of the rows 38. For example, in one embodiment, counter cells 58A may be configured in certain rows 38 (e.g., in row positions 0, 4, 8, and 12), while the Boolean logic cells 58B may be configured in the remaining of the 16 rows 38 (e.g., in row positions 1, 2, 3, 5, 6, 7, 9, 10, 11, 13, 14, 15, and 16). The GOT 60 and the special purpose elements 58 may be selectively coupled (e.g., selectively connected) in each row 38 through intra-row switching elements 44, where each row 38 of the block 32 may be selectively coupled with any of the other rows 38 of the block 32 through intra-block switching elements 42.

In some embodiments, each active GOT 60 in each row 38 may output a signal indicating whether one or more conditions are detected (e.g., a search result is detected), and the special purpose element 58 in the row 38 may receive the GOT 60 output to determine whether certain quantifiers of the one or more conditions are met and/or count a number of times a condition is detected. For example, quantifiers of a count operation may include determining whether a condition was detected at least a certain number of times, determining whether a condition was detected no more than a certain number of times, determining whether a condition was detected exactly a certain number of times, and determining whether a condition was detected within a certain range of times.

Outputs from the counter 58A and/or the Boolean logic cell 58B may be communicated through the intra-row switching elements 44 and the intra-block switching elements 42 to perform counting or logic with greater complexity. For example, counters 58A may be configured to implement the quantifiers, such as asserting an output only when a condition is detected an exact number of times. Counters 58A in a block 32 may also be used concurrently, thereby increasing the total bit count of the combined counters to count higher numbers of a detected condition. Furthermore, in some embodiments, different special purpose elements 58 such as counters 58A and Boolean logic cells 58B may be used together. For example, an output of one or more Boolean logic cells 58B may be counted by one or more counters 58A in a block 32.

Figure 5:
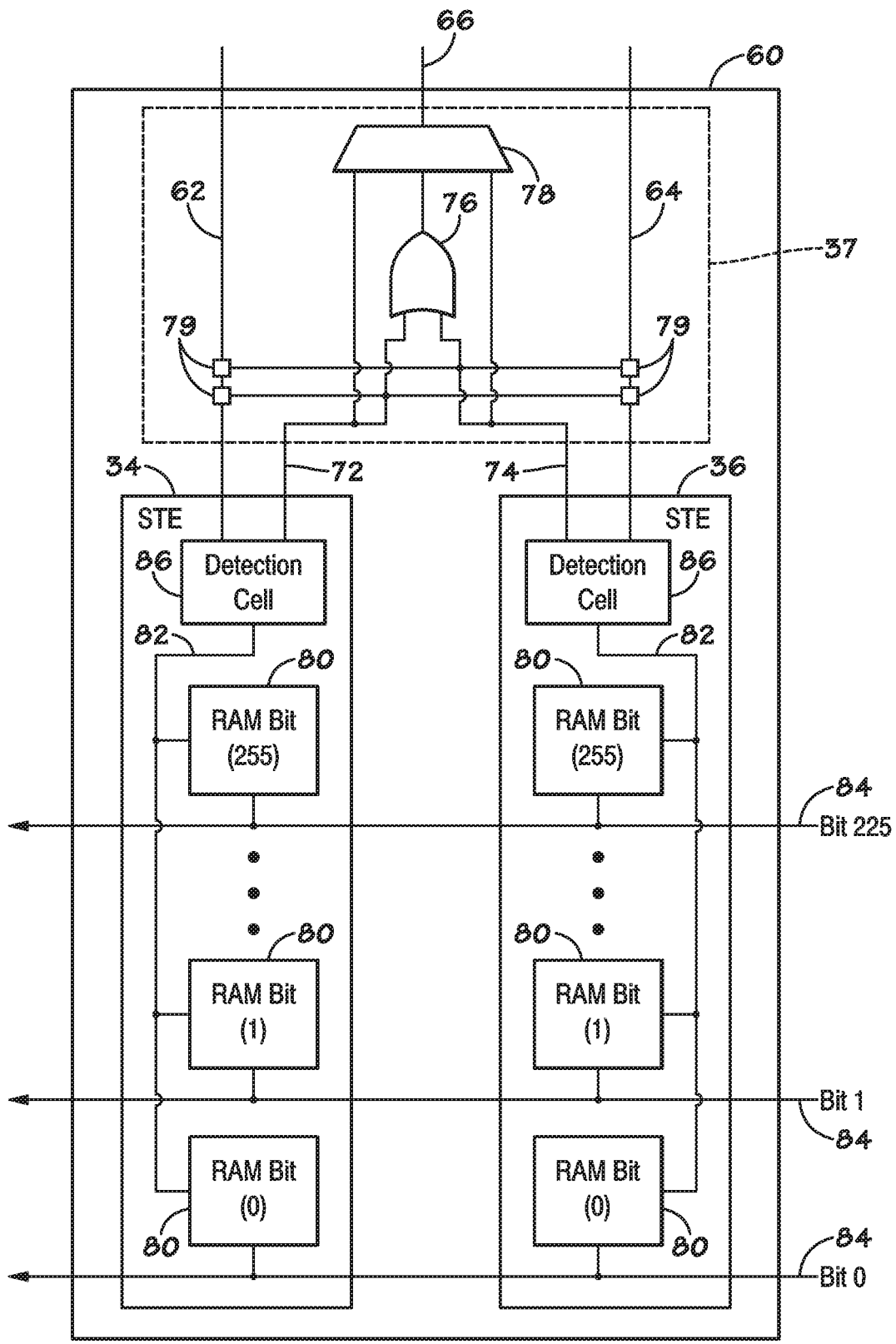
FIG. 5 illustrates an example of a Group of Two of the row of FIG. 4, according to embodiments.

FIG. 5 illustrates an example of a GOT 60. The GOT 60 includes a first STE 34, a second STE 36, and intra-group circuitry 37 coupled to the first STE 34 and the second STE 36. For example, the first STE 34 and the second STE 36 may have inputs 62, 64 and outputs 72, 74 coupled to an OR gate 76 and a 3-to-1 multiplexer 78 of the intra-group circuitry 37. The 3-to-1 multiplexer 78 can be set to couple the output 66 of the GOT 60 to either the first STE 34, the second STE 36, or the OR gate 76. The OR gate 76 can be used to couple together both outputs 72, 74 to form the common output 66 of the GOT 60. In an example, the first and second STE 34, 36 exhibit parity, as discussed above, where the input 62 of the first STE 34 can be coupled to some of the row interconnection conductors 68 and the input 64 of the second STE 36 can be coupled to other row interconnection conductors 70 the common output 66 may be produced which may overcome parity problems. In an example, the two STEs 34, 36 within a GOT 60 can be cascaded and/or looped back to themselves by setting either or both of switching elements 79. The STEs 34, 36 can be cascaded by coupling the output 72, 74 of the STEs 34, 36 to the input 62, 64 of the other STE 34, 36. The STEs 34, 36 can be looped back to themselves by coupling the output 72, 74 to their own input 62, 64. Accordingly, the output 72 of the first STE 34 can be coupled to neither, one, or both of the input 62 of the first STE 34 and the input 64 of the second STE 36. Additionally, as each of the inputs 62, 64 may be coupled to a plurality of row routing lines, an OR gate may be utilized to select any of the inputs from these row routing lines along inputs 62, 64, as well as the outputs 72, 74.

In an example, each state transition element 34, 36 comprises a plurality of memory cells 80, such as those often used in dynamic random access memory (DRAM), coupled in parallel to a detect line 82. One such memory cell 80 comprises a memory cell that can be set to a data state, such as one that corresponds to either a high or a low value (e.g., a 1 or 0). The output of the memory cell 80 is coupled to the detect line 82 and the input to the memory cell 80 receives signals based on data on the data stream line 84. In an example, an input at the input block 52 is decoded to select one or more of the memory cells 80. The selected memory cell 80 provides its stored data state as an output onto the detect line 82. For example, the data received at the input block 52 can be provided to a decoder (not shown) and the decoder can select one or more of the data stream lines 84. In an example, the decoder can convert an 8-bit ACSII character to the corresponding 1 of 256 data stream lines 84.

A memory cell 80, therefore, outputs a high signal to the detect line 82 when the memory cell 80 is set to a high value and the data on the data stream line 84 selects the memory cell 80. When the data on the data stream line 84 selects the memory cell 80 and the memory cell 80 is set to a low value, the memory cell 80 outputs a low signal to the detect line 82. The outputs from the memory cells 80 on the detect line 82 are sensed by a detection cell 86.

In an example, the signal on an input line 62, 64 sets the respective detection cell 86 to either an active or inactive state. When set to the inactive state, the detection cell 86 outputs a low signal on the respective output 72, 74 regardless of the signal on the respective detect line 82. When set to an active state, the detection cell 86 outputs a high signal on the respective output line 72, 74 when a high signal is detected from one of the memory cells 80 of the respective STE 34, 36. When in the active state, the detection cell 86 outputs a low signal on the respective output line 72, 74 when the signals from all of the memory cells 82 of the respective STE 34, 36 are low.

In an example, an STE 34, 36 includes 256 memory cells 80 and each memory cell 80 is coupled to a different data stream line 84. Thus, an STE 34, 36 can be programmed to output a high signal when a selected one or more of the data stream lines 84 have a high signal thereon. For example, the STE 34 can have a first memory cell 80 (e.g., bit 0) set high and all other memory cells 80 (e.g., bits 1-255) set low. When the respective detection cell 86 is in the active state, the STE 34 outputs a high signal on the output 72 when the data stream line 84 corresponding to bit 0 has a high signal thereon. In other examples, the STE 34 can be set to output a high signal when one of multiple data stream lines 84 have a high signal thereon by setting the appropriate memory cells 80 to a high value.

In an example, a memory cell 80 can be set to a high or low value by reading bits from an associated register. Accordingly, the STEs 34 can be configured by storing an image created by the compiler 20 into the registers and loading the bits in the registers into associated memory cells 80. In an example, the image created by the compiler 20 includes a binary image of high and low (e.g., 1 and 0) bits. The image can configure the FSM lattice 30 to implement a FSM by cascading the STEs 34, 36. For example, a first STE 34 can be set to an active state by setting the detection cell 86 to the active state. The first STE 34 can be set to output a high signal when the data stream line 84 corresponding to bit 0 has a high signal thereon. The second STE 36 can be initially set to an inactive state, but can be set to, when active, output a high signal when the data stream line 84 corresponding to bit 1 has a high signal thereon. The first STE 34 and the second STE 36 can be cascaded by setting the output 72 of the first STE 34 to couple to the input 64 of the second STE 36. Thus, when a high signal is sensed on the data stream line 84 corresponding to bit 0, the first STE 34 outputs a high signal on the output 72 and sets the detection cell 86 of the second STE 36 to an active state. When a high signal is sensed on the data stream line 84 corresponding to bit 1, the second STE 36 outputs a high signal on the output 74 to activate another STE 36 or for output from the FSM lattice 30.

In an example, a single FSM lattice 30 is implemented on a single physical device, however, in other examples two or more FSM lattices 30 can be implemented on a single physical device (e.g., physical chip). In an example, each FSM lattice 30 can include a distinct data input block 52, a distinct output block 54, a distinct programming interface 56, and a distinct set of configurable elements. Moreover, each set of configurable elements can react (e.g., output a high or low signal) to data at their corresponding data input block 52. For example, a first set of configurable elements corresponding to a first FSM lattice 30 can react to the data at a first data input block 52 corresponding to the first FSM lattice 30. A second set of configurable elements corresponding to a second FSM lattice 30 can react to a second data input block 52 corresponding to the second FSM lattice 30. Accordingly, each FSM lattice 30 includes a set of configurable elements, wherein different sets of configurable elements can react to different input data. Similarly, each FSM lattice 30, and each corresponding set of configurable elements can provide a distinct output. In some examples, an output block 54 from a first FSM lattice 30 can be coupled to an input block 52 of a second FSM lattice 30, such that input data for the second FSM lattice 30 can include the output data from the first FSM lattice 30 in a hierarchical arrangement of a series of FSM lattices 30.

In an example, an image for loading onto the FSM lattice 30 comprises a plurality of bits of data for configuring the configurable elements, the configurable switching elements, and the special purpose elements within the FSM lattice 30. In an example, the image can be loaded onto the FSM lattice 30 to configure the FSM lattice 30 to provide a desired output based on certain inputs. The output block 54 can provide outputs from the FSM lattice 30 based on the reaction of the configurable elements to data at the data input block 52. An output from the output block 54 can include a single bit indicating a search result of a given pattern, a word comprising a plurality of bits indicating search results and non-search results to a plurality of patterns, and a state vector corresponding to the state of all or certain configurable elements at a given moment. As described, a number of FSM lattices 30 may be included in a state machine engine, such as state machine engine 14, to perform data analysis, such as pattern-recognition (e.g., speech recognition, image recognition, etc.) signal processing, imaging, computer vision, cryptography, and others.

Figure 6:
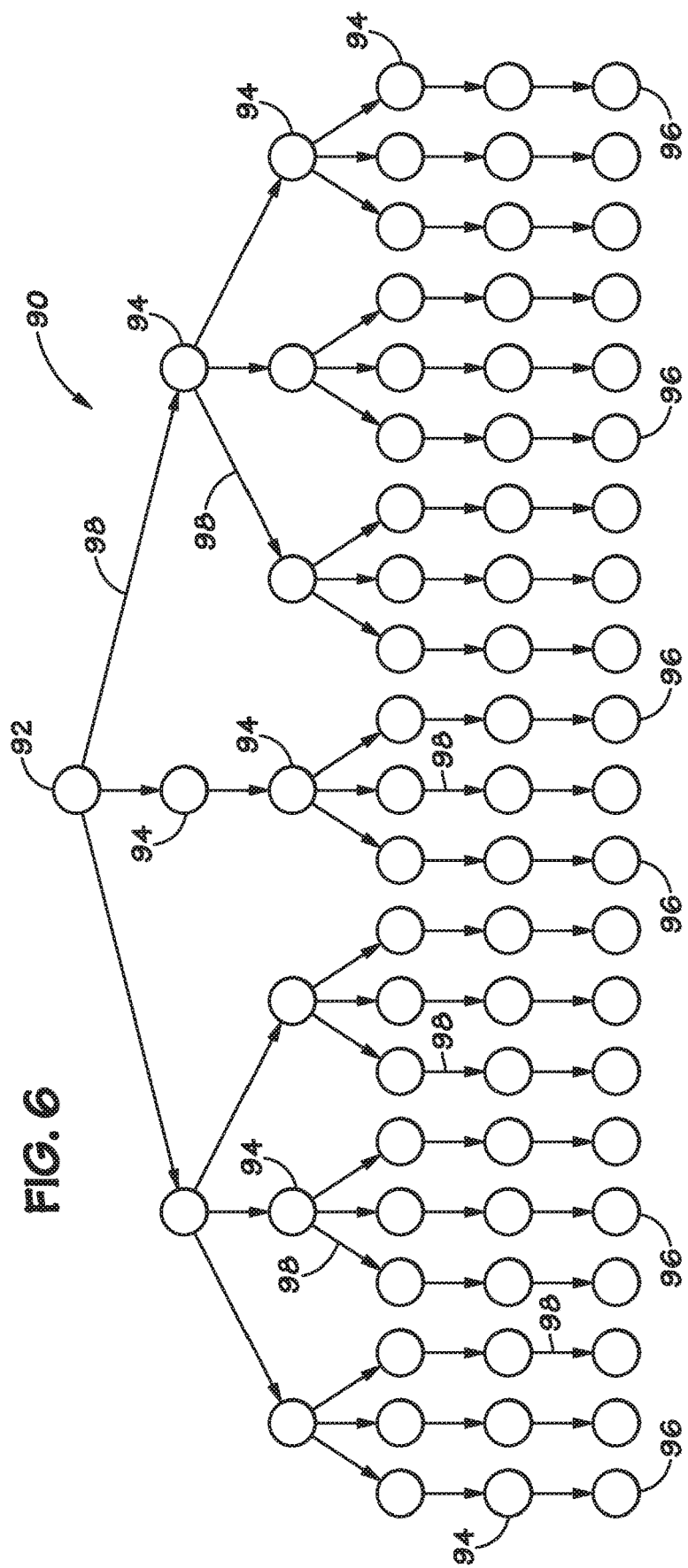
FIG. 6 illustrates an example of a finite state machine graph, according to various embodiments.

FIG. 6 illustrates an example model of a finite state machine (FSM) that can be implemented by the FSM lattice 30. The FSM lattice 30 can be configured (e.g., programmed) as a physical implementation of a FSM. A FSM can be represented as a diagram 90, (e.g., directed graph, undirected graph, pseudograph), which contains one or more root nodes 92. In addition to the root nodes 92, the FSM can be made up of several standard nodes 94 and terminal nodes 96 that are connected to the root nodes 92 and other standard nodes 94 through one or more edges 98. A node 92, 94, 96 corresponds to a state in the FSM. The edges 98 correspond to the transitions between the states.

Each of the nodes 92, 94, 96 can be in either an active or an inactive state. When in the inactive state, a node 92, 94, 96 does not react (e.g., respond) to input data. When in an active state, a node 92, 94, 96 can react to input data. An upstream node 92, 94 can react to the input data by activating a node 94, 96 that is downstream from the node when the input data matches criteria specified by an edge 98 between the upstream node 92, 94 and the downstream node 94, 96. For example, a first node 94 that specifies the character 'b' will activate a second node 94 connected to the first node 94 by an edge 98 when the first node 94 is active and the character 'b' is received as input data. As used herein, "upstream" refers to a relationship between one or more nodes, where a first node that is upstream of one or more other nodes (or upstream of itself in the case of a loop or feedback configuration) refers to the situation in which the first node can activate the one or more other nodes (or can activate itself in the case of a loop). Similarly, "downstream" refers to a relationship where a first node that is downstream of one or more other nodes (or downstream of itself in the case of a loop) can be activated by the one or more other nodes (or can be activated by itself in the case of a loop). Accordingly, the terms "upstream" and "downstream" are used herein to refer to relationships between one or more nodes, but these terms do not preclude the use of loops or other non-linear paths among the nodes.

In the diagram 90, the root node 92 can be initially activated and can activate downstream nodes 94 when the input data matches an edge 98 from the root node 92. Nodes 94 can activate nodes 96 when the input data matches an edge 98 from the node 94. Nodes 94, 96 throughout the diagram 90 can be activated in this manner as the input data is received. A terminal node 96 corresponds to a search result of a sequence of interest in the input data. Accordingly, activation of a terminal node 96 indicates that a sequence of interest has been received as the input data. In the context of the FSM lattice 30 implementing a pattern recognition function, arriving at a terminal node 96 can indicate that a specific pattern of interest has been detected in the input data.

In an example, each root node 92, standard node 94, and terminal node 96 can correspond to a configurable element in the FSM lattice 30. Each edge 98 can correspond to connections between the configurable elements. Thus, a standard node 94 that transitions to (e.g., has an edge 98 connecting to) another standard node 94 or a terminal node 96 corresponds to a configurable element that transitions to (e.g., provides an output to) another configurable element. In some examples, the root node 92 does not have a corresponding configurable element.

As will be appreciated, although the node 92 is described as a root node and nodes 96 are described as terminal nodes, there may not necessarily be a particular "start" or root node and there may not necessarily be a particular "end" or output node. In other words, any node may be a starting point and any node may provide output.

When the FSM lattice 30 is programmed, each of the configurable elements can also be in either an active or inactive state. A given configurable element, when inactive, does not react to the input data at a corresponding data input block 52. An active configurable element can react to the input data at the data input block 52, and can activate a downstream configurable element when the input data matches the setting of the configurable element. When a configurable element corresponds to a terminal node 96, the configurable element can be coupled to the output block 54 to provide an indication of a search result to an external device.

An image loaded onto the FSM lattice 30 via the programming interface 56 can configure the configurable elements and special purpose elements, as well as the connections between the configurable elements and special purpose elements, such that a desired FSM is implemented through the sequential activation of nodes based on reactions to the data at the data input block 52. In an example, a configurable element remains active for a single data cycle (e.g., a single character, a set of characters, a single clock cycle) and then becomes inactive unless re-activated by an upstream configurable element.

A terminal node 96 can be considered to store a compressed history of past search results. For example, the one or more patterns of input data required to reach a terminal node 96 can be represented by the activation of that terminal node 96. In an example, the output provided by a terminal node 96 is binary, for example, the output indicates whether a search result for a pattern of interest has been generated or not. The ratio of terminal nodes 96 to standard nodes 94 in a diagram 90 may be quite small. In other words, although there may be a high complexity in the FSM, the output of the FSM may be small by comparison.

In an example, the output of the FSM lattice 30 can comprise a state vector. The state vector comprises the state (e.g., activated or not activated) of configurable elements of the FSM lattice 30. In another example, the state vector can include the state of all or a subset of the configurable elements whether or not the configurable elements corresponds to a terminal node 96. In an example, the state vector includes the states for the configurable elements corresponding to terminal nodes 96. Thus, the output can include a collection of the indications provided by all terminal nodes 96 of a diagram 90. The state vector can be represented as a word, where the binary indication provided by each terminal node 96 comprises one bit of the word. This encoding of the terminal nodes 96 can provide an effective indication of the detection state (e.g., whether and what sequences of interest have been detected) for the FSM lattice 30.

As mentioned above, the FSM lattice 30 can be programmed to implement a pattern recognition function. For example, the FSM lattice 30 can be configured to recognize one or more data sequences (e.g., signatures, patterns) in the input data. When a data sequence of interest is recognized by the FSM lattice 30, an indication of that recognition can be provided at the output block 54. In an example, the pattern recognition can recognize a string of symbols (e.g., ASCII characters) to, for example, identify malware or other data in network data.

Figure 7:
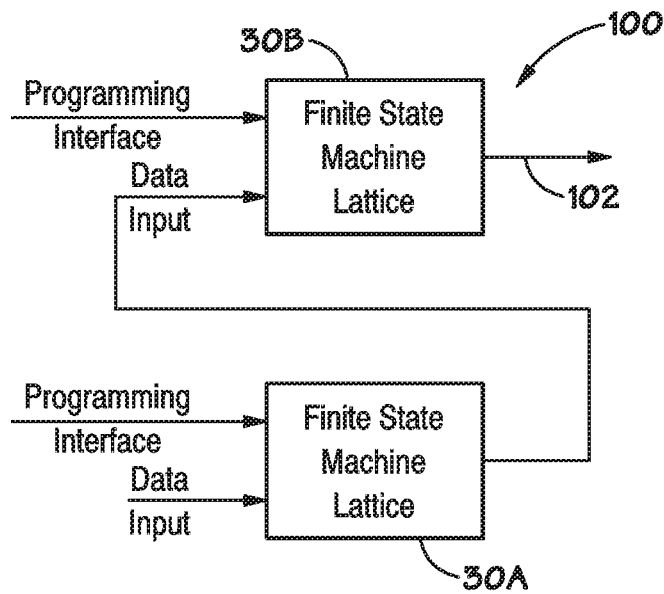
FIG. 7 illustrates an example of two-level hierarchy implemented with FSM lattices, according to various embodiments.

FIG. 7 illustrates an example of hierarchical structure 100, wherein two levels of FSM lattices 30 are coupled in series and used to analyze data. Specifically, in the illustrated embodiment, the hierarchical structure 100 includes a first FSM lattice 30A and a second FSM lattice 30B arranged in series. Each FSM lattice 30 includes a respective data input block 52 to receive data input, a programming interface block 56 to receive configuring signals and an output block 54.

The first FSM lattice 30A is configured to receive input data, for example, raw data at a data input block. The first FSM lattice 30A reacts to the input data as described above and provides an output at an output block. The output from the first FSM lattice 30A is sent to a data input block of the second FSM lattice 30B. The second FSM lattice 30B can then react based on the output provided by the first FSM lattice 30A and provide a corresponding output signal 102 of the hierarchical structure 100. This hierarchical coupling of two FSM lattices 30A and 30B in series provides a means to provide data regarding past search results in a compressed word from a first FSM lattice 30A to a second FSM lattice 30B. The data provided can effectively be a summary of complex matches (e.g., sequences of interest) that were recorded by the first FSM lattice 30A.

Figure 7A:
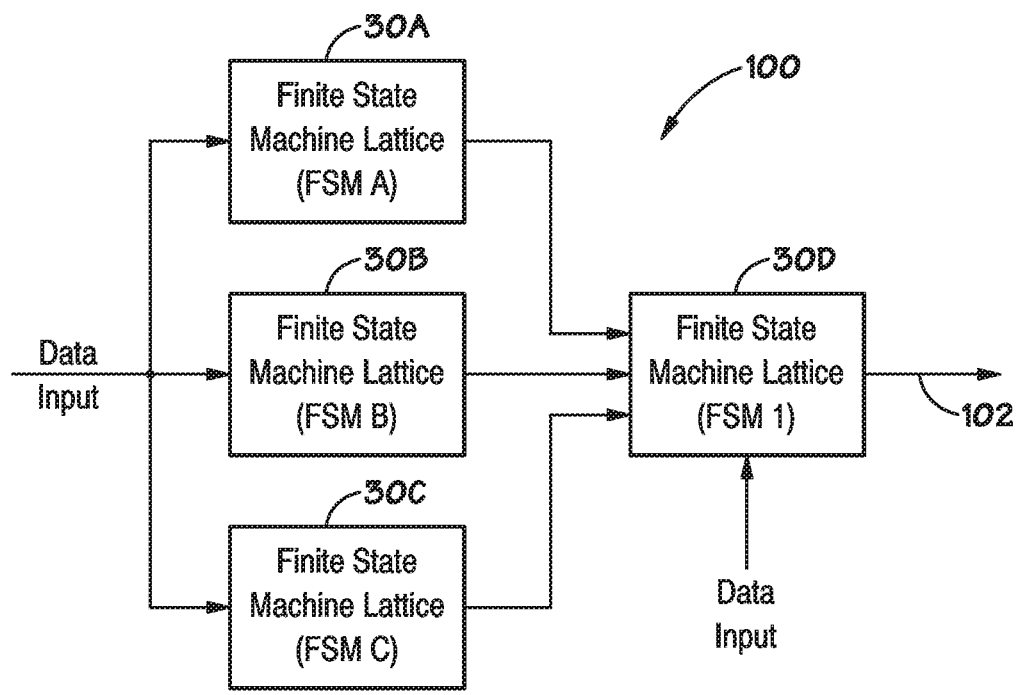
FIG. 7A illustrates a second example of two-level hierarchy implemented with FSM lattices, according to various embodiments.

FIG. 7A illustrates a second two-level hierarchy 100 of FSM lattices 30A, 30B, 30C, and 30D, which allows the overall FSM 100 (inclusive of all or some of FSM lattices 30A, 30B, 30C, and 30D) to perform two independent levels of analysis of the input data. The first level (e.g., FSM lattice 30A, FSM lattice 30B, and/or FSM lattice 30C) analyzes the same data stream, which includes data inputs to the overall FSM 100. The outputs of the first level (e.g., FSM lattice 30A, FSM lattice 30B, and/or FSM lattice 30C) become the inputs to the second level, (e.g., FSM lattice 30D). FSM lattice 30D performs further analysis of the combination the analysis already performed by the first level (e.g., FSM lattice 30A, FSM lattice 30B, and/or FSM lattice 30C). By connecting multiple FSM lattices 30A, 30B, and 30C together, increased knowledge about the data stream input may be obtained by FSM lattice 30D.

The first level of the hierarchy (implemented by one or more of FSM lattice 30A, FSM lattice 30B, and FSM lattice 30C) can, for example, perform processing directly on a raw data stream. For example, a raw data stream can be received at an input block 52 of the first level FSM lattices 30A, 30B, and/or 30C and the configurable elements of the first level FSM lattices 30A, 30B, and/or 30C can react to the raw data stream. The second level (implemented by the FSM lattice 30D) of the hierarchy can process the output from the first level. For example, the second level FSM lattice 30D receives the output from an output block 54 of the first level FSM lattices 30A, 30B, and/or 30C at an input block 52 of the second level FSM lattice 30D and the configurable elements of the second level FSM lattice 30D can react to the output of the first level FSM lattices 30A, 30B, and/or 30C. Accordingly, in this example, the second level FSM lattice 30D does not receive the raw data stream as an input, but rather receives the indications of search results for patterns of interest that are generated from the raw data stream as determined by one or more of the first level FSM lattices 30A, 30B, and/or 30C. Thus, the second level FSM lattice 30D can implement a FSM 100 that recognizes patterns in the output data stream from the one or more of the first level FSM lattices 30A, 30B, and/or 30C. However, it should also be appreciated that the second level FSM lattice 30D can additionally receive the raw data stream as an input, for example, in conjunction with the indications of search results for patterns of interest that are generated from the raw data stream as determined by one or more of the first level FSM lattices 30A, 30B, and/or 30C. It should be appreciated that the second level FSM lattice 30D may receive inputs from multiple other FSM lattices in addition to receiving output from the one or more of the first level FSM lattices 30A, 30B, and/or 30C. Likewise, the second level FSM lattice 30D may receive inputs from other devices. The second level FSM lattice 30D may combine these multiple inputs to produce outputs. Finally, while only two levels of FSM lattices 30A, 30B, 30C, and 30D are illustrated, it is envisioned that additional levels of FSM lattices may be stacked such that there are, for example, three, four, 10, 100, or more levels of FSM lattices.

Figure 8:
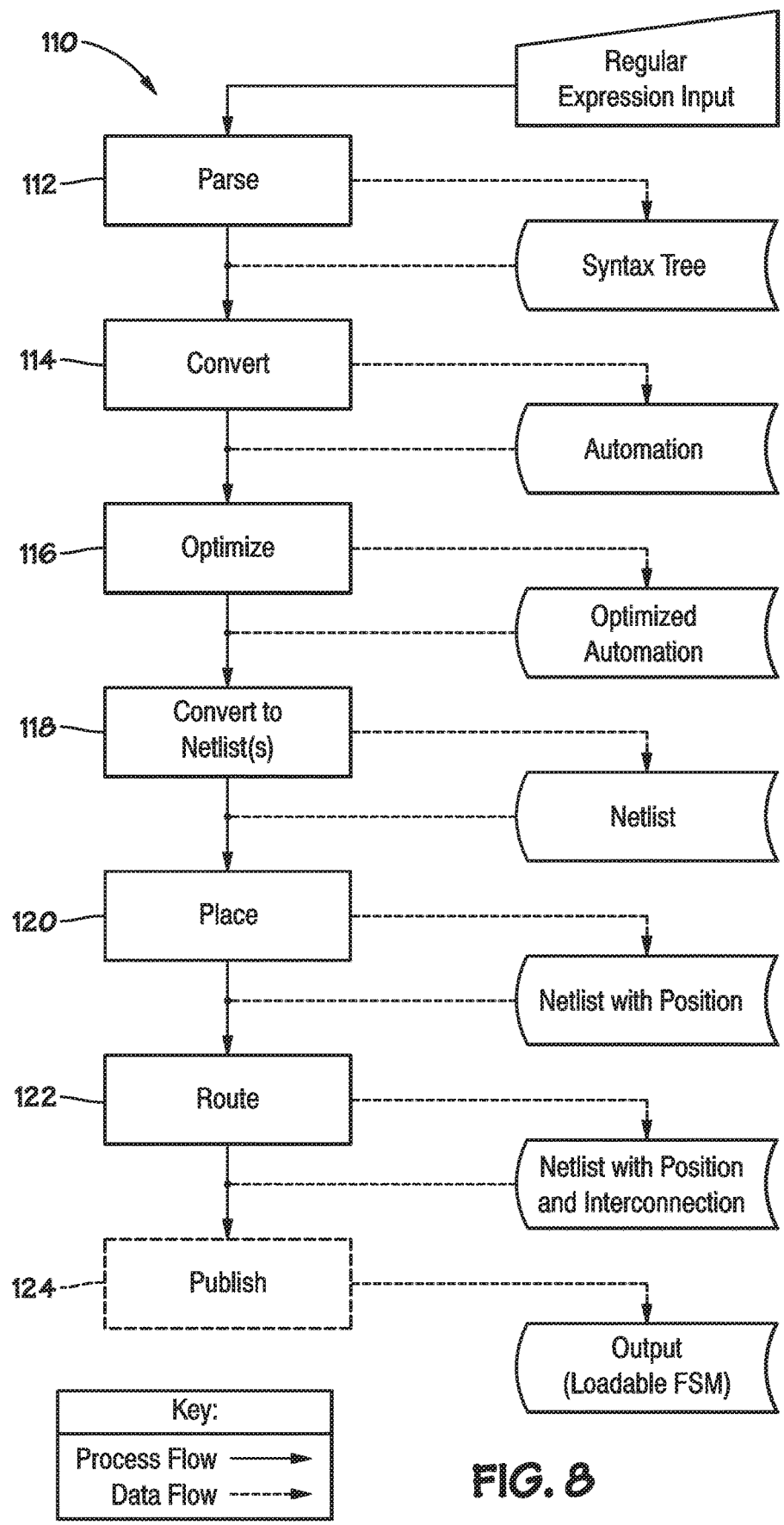
FIG. 8 illustrates an example of a method for a compiler to convert source code into a binary file for programming of the FSM lattice of FIG. 2, according to various embodiments.

FIG. 8 illustrates an example of a method 110 for a compiler to convert source code into an image used to configure a FSM lattice, such as lattice 30, to implement a FSM. Method 110 includes parsing the source code into a syntax tree (block 112), converting the syntax tree into an automaton (block 114), optimizing the automaton (block 116), converting the automaton into a netlist (block 118), placing the netlist on hardware (block 120), routing the netlist (block 122), and publishing the resulting image (block 124).

In an example, the compiler 20 includes an application programming interface (API) that allows software developers to create images for implementing FSMs on the FSM lattice 30. The compiler 20 provides methods to convert an input set of regular expressions in the source code into an image that is configured to configure the FSM lattice 30. The compiler 20 can be implemented by instructions for a computer having a von Neumann architecture. These instructions can cause a processor 12 on the computer to implement the functions of the compiler 20. For example, the instructions, when executed by the processor 12, can cause the processor 12 to perform actions as described in blocks 112, 114, 116, 118, 120, 122, and 124 on source code that is accessible to the processor 12.

In an example, the source code describes search strings for identifying patterns of symbols within a group of symbols. To describe the search strings, the source code can include a plurality of regular expressions (regexes). A regex can be a string for describing a symbol search pattern. Regexes are widely used in various computer domains, such as programming languages, text editors, network security, and others. In an example, the regular expressions supported by the compiler include criteria for the analysis of unstructured data. Unstructured data can include data that is free form and has no indexing applied to words within the data. Words can include any combination of bytes, printable and non-printable, within the data. In an example, the compiler can support multiple different source code languages for implementing regexes including Perl, (e.g., Perl compatible regular expressions (PCRE)), PHP, Java, and .NET languages.

At block 112 the compiler 20 can parse the source code to form an arrangement of relationally connected operators, where different types of operators correspond to different functions implemented by the source code (e.g., different functions implemented by regexes in the source code). Parsing source code can create a generic representation of the source code. In an example, the generic representation comprises an encoded representation of the regexes in the source code in the form of a tree graph known as a syntax tree. The examples described herein refer to the arrangement as a syntax tree (also known as an "abstract syntax tree") in other examples, however, a concrete syntax tree as part of the abstract syntax tree, a concrete syntax tree in place of the abstract syntax tree, or other arrangement can be used.

Since, as mentioned above, the compiler 20 can support multiple languages of source code, parsing converts the source code, regardless of the language, into a non-language specific representation, e.g., a syntax tree. Thus, further processing (blocks 114, 116, 118, 120) by the compiler 20 can work from a common input structure regardless of the language of the source code.

As noted above, the syntax tree includes a plurality of operators that are relationally connected. A syntax tree can include multiple different types of operators. For example, different operators can correspond to different functions implemented by the regexes in the source code.

At block 114, the syntax tree is converted into an automaton. An automaton comprises a software model of a FSM which may, for example, comprise a plurality of states. In order to convert the syntax tree into an automaton, the operators and relationships between the operators in the syntax tree are converted into states with transitions between the states. Moreover, in one embodiment, conversion of the automaton is accomplished based on the hardware of the FSM lattice 30.

In an example, input symbols for the automaton include the symbols of the alphabet, the numerals 0-9, and other printable characters. In an example, the input symbols are represented by the byte values 0 through 255 inclusive. In an example, an automaton can be represented as a directed graph where the nodes of the graph correspond to the set of states. In an example, a transition from state p to state q on an input symbol α, i.e. δ(p, α), is shown by a directed connection from node p to node q. In an example, a reversal of an automaton produces a new automaton where each transition p→q on some symbol α is reversed q→p on the same symbol. In a reversal, start states become final states and the final states become start states. In an example, the language recognized (e.g., matched) by an automaton is the set of all possible character strings which when input sequentially into the automaton will reach a final state. Each string in the language recognized by the automaton traces a path from the start state to one or more final states.

At block 116, after the automaton is constructed, the automaton is optimized to reduce its complexity and size, among other things. The automaton can be optimized by combining redundant states.

At block 118, the optimized automaton is converted into a netlist. Converting the automaton into a netlist maps each state of the automaton to a hardware element (e.g., STEs 34, 36, other elements) on the FSM lattice 30, and determines the connections between the hardware elements.

At block 120, the netlist is placed to select a specific hardware element of the target device (e.g., STEs 34, 36, special purpose elements 58) corresponding to each node of the netlist. In an example, placing selects each specific hardware element based on general input and output constraints for the FSM lattice 30.

At block 122, the placed netlist is routed to determine the settings for the configurable switching elements (e.g., inter-block switching elements 40, intra-block switching elements 42, and intra-row switching elements 44) in order to couple the selected hardware elements together to achieve the connections describe by the netlist. In an example, the settings for the configurable switching elements are determined by determining specific conductors of the FSM lattice 30 that will be used to connect the selected hardware elements, and the settings for the configurable switching elements. Routing can take into account more specific limitations of the connections between the hardware elements than can be accounted for via the placement at block 120. Accordingly, routing may adjust the location of some of the hardware elements as determined by the global placement in order to make appropriate connections given the actual limitations of the conductors on the FSM lattice 30.

Once the netlist is placed and routed, the placed and routed netlist can be converted into a plurality of bits for configuring a FSM lattice 30. The plurality of bits are referred to herein as an image (e.g., binary image).

At block 124, an image is published by the compiler 20. The image comprises a plurality of bits for configuring specific hardware elements of the FSM lattice 30. The bits can be loaded onto the FSM lattice 30 to configure the state of STEs 34, 36, the special purpose elements 58, and the configurable switching elements such that the programmed FSM lattice 30 implements a FSM having the functionality described by the source code. Placement (block 120) and routing (block 122) can map specific hardware elements at specific locations in the FSM lattice 30 to specific states in the automaton. Accordingly, the bits in the image can configure the specific hardware elements to implement the desired function(s). In an example, the image can be published by saving the machine code to a computer readable medium. In another example, the image can be published by displaying the image on a display device. In still another example, the image can be published by sending the image to another device, such as a configuring device for loading the image onto the FSM lattice 30. In yet another example, the image can be published by loading the image onto a FSM lattice (e.g., the FSM lattice 30).

In an example, an image can be loaded onto the FSM lattice 30 by either directly loading the bit values from the image to the STEs 34, 36 and other hardware elements or by loading the image into one or more registers and then writing the bit values from the registers to the STEs 34, 36 and other hardware elements. In an example, the hardware elements (e.g., STEs 34, 36, special purpose elements 58, configurable switching elements 40, 42, 44) of the FSM lattice 30 are memory mapped such that a configuring device and/or computer can load the image onto the FSM lattice 30 by writing the image to one or more memory addresses.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

Figure 9:
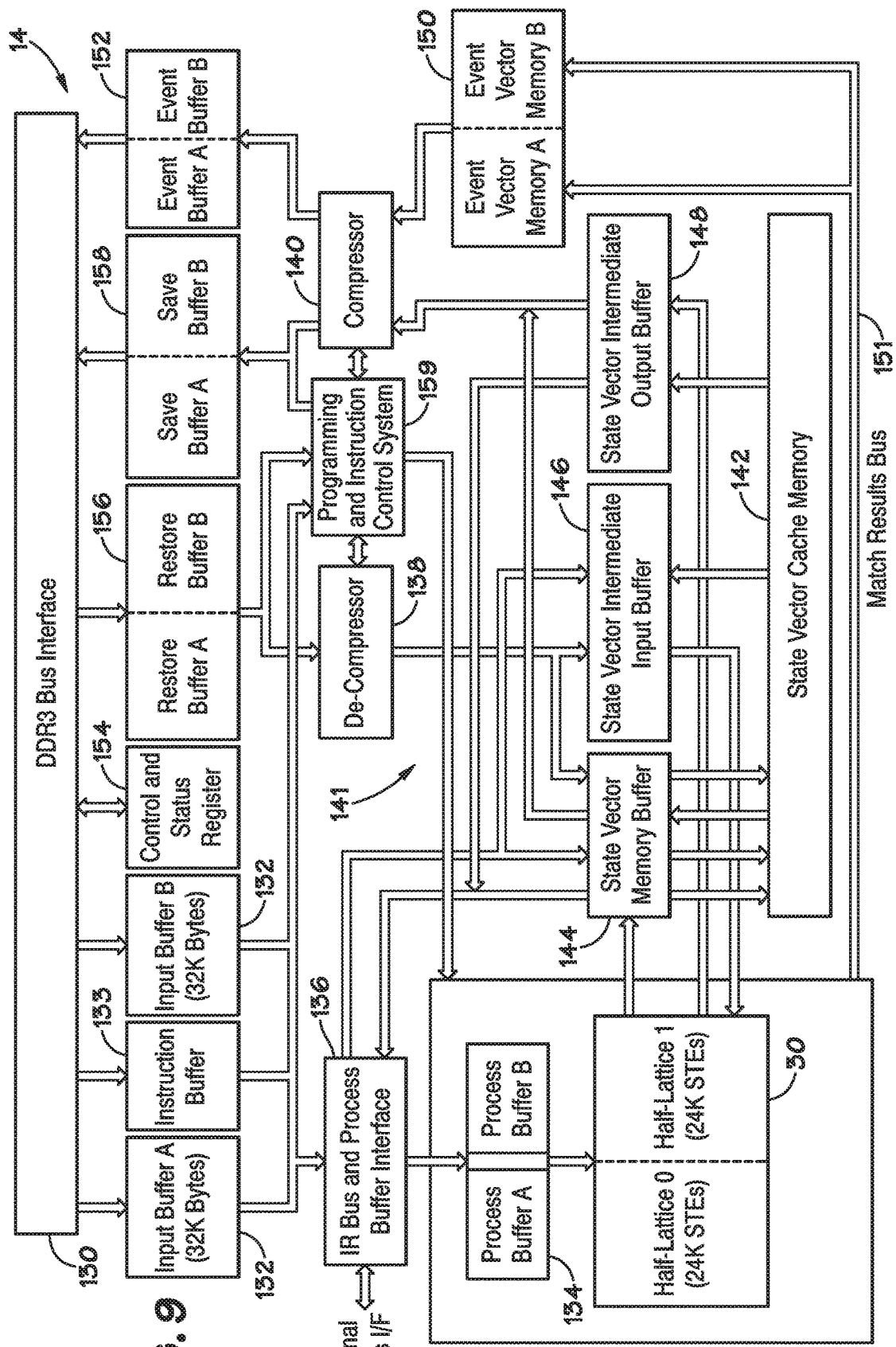
FIG. 9 illustrates a state machine engine, according to various embodiments.

Referring now to FIG. 9, an embodiment of the state machine engine 14 (e.g., a single device on a single chip) is illustrated. As previously described, the state machine engine 14 is configured to receive data from a source, such as the memory 16 over a data bus. In the illustrated embodiment, data may be sent to the state machine engine 14 through a bus interface, such as a double data rate three (DDR3) bus interface 130. The DDR3 bus interface 130 may be capable of exchanging (e.g., providing and receiving) data at a rate greater than or equal to 1 GByte/sec. Such a data exchange rate may be greater than a rate that data is analyzed by the state machine engine 14. As will be appreciated, depending on the source of the data to be analyzed, the bus interface 130 may be any suitable bus interface for exchanging data to and from a data source to the state machine engine 14, such as a NAND Flash interface, peripheral component interconnect (PCI) interface, gigabit media independent interface (GMMI), etc. As previously described, the state machine engine 14 includes one or more FSM lattices 30 configured to analyze data. Each FSM lattice 30 may be divided into two half-lattices. In the illustrated embodiment, each half lattice may include 24K STEs (e.g., STEs 34, 36), such that the lattice 30 includes 48K STEs. The lattice 30 may comprise any desirable number of STEs, arranged as previously described with regard to FIGS. 2-5. Further, while only one FSM lattice 30 is illustrated, the state machine engine 14 may include multiple FSM lattices 30, as previously described.

Data to be analyzed may be received at the bus interface 130 and provided to the FSM lattice 30 through a number of buffers and buffer interfaces. In the illustrated embodiment, the data path includes input buffers 132, an instruction buffer 133, process buffers 134, and an inter-rank (IR) bus and process buffer interface 136. The input buffers 132 are configured to receive and temporarily store data to be analyzed. In one embodiment, there are two input buffers 132 (input buffer A and input buffer B). Data may be stored in one of the two data input 132, while data is being emptied from the other input buffer 132, for analysis by the FSM lattice 30. The bus interface 130 may be configured to provide data to be analyzed to the input buffers 132 until the input buffers 132 are full. After the input buffers 132 are full, the bus interface 130 may be configured to be free to be used for other purpose (e.g., to provide other data from a data stream until the input buffers 132 are available to receive additional data to be analyzed). In the illustrated embodiment, the input buffers 132 may be 32 KBytes each. The instruction buffer 133 is configured to receive instructions from the processor 12 via the bus interface 130, such as instructions that correspond to the data to be analyzed and instructions that correspond to configuring the state machine engine 14. The IR bus and process buffer interface 136 may facilitate providing data to the process buffer 134. The IR bus and process buffer interface 136 can be used to ensure that data is processed by the FSM lattice 30 in order. The IR bus and process buffer interface 136 may coordinate the exchange of data, timing data, packing instructions, etc. such that data is received and analyzed correctly. Generally, the IR bus and process buffer interface 136 allows the analyzing of multiple data sets in parallel through a logical rank of FSM lattices 30. For example, multiple physical devices (e.g., state machine engines 14, chips, separate devices) may be arranged in a rank and may provide data to each other via the IR bus and process buffer interface 136. For purposes of this application the term "rank" refers to a set of state machine engines 14 connected to the same chip select. In the illustrated embodiment, the IR bus and process buffer interface 136 may include a 32 bit data bus. In other embodiments, the IR bus and process buffer interface 136 may include any suitable data bus, such as a 128 bit data bus.

In the illustrated embodiment, the state machine engine 14 also includes a de-compressor 138 and a compressor 140 to aid in providing state vector data through the state machine engine 14. The compressor 140 and de-compressor 138 work in conjunction such that the state vector data can be compressed to minimize the data providing times. By compressing the state vector data, the bus utilization time may be minimized. The compressor 140 and de-compressor 138 can also be configured to handle state vector data of varying burst lengths. By padding compressed state vector data and including an indicator as to when each compressed region ends, the compressor 140 may improve the overall processing speed through the state machine engine 14. The compressor 140 may be used to compress results data after analysis by the FSM lattice 30. The compressor 140 and de-compressor 138 may also be used to compress and decompress configuration data. In one embodiment, the compressor 140 and de-compressor 138 may be disabled (e.g., turned off) such that data flowing to and/or from the compressor 140 and de-compressor 138 is not modified.

As previously described, an output of the FSM lattice 30 can comprise a state vector. The state vector comprises the state (e.g., activated or not activated) of the STEs 34, 36 of the FSM lattice 30 and the dynamic (e.g., current) count of the counter 58. The state machine engine 14 includes a state vector system 141 having a state vector cache memory 142, a state vector memory buffer 144, a state vector intermediate input buffer 146, and a state vector intermediate output buffer 148. The state vector system 141 may be used to store multiple state vectors of the FSM lattice 30 and to provide a state vector to the FSM lattice 30 to restore the FSM lattice 30 to a state corresponding to the provided state vector. For example, each state vector may be temporarily stored in the state vector cache memory 142. For example, the state of each STE 34, 36 may be stored, such that the state may be restored and used in further analysis at a later time, while freeing the STEs 34, 36 for further analysis of a new data set (e.g., search terms). Like a typical cache, the state vector cache memory 142 allows storage of state vectors for quick retrieval and use, here by the FSM lattice 30, for instance. In the illustrated embodiment, the state vector cache memory 142 may store up to 512 state vectors.

As will be appreciated, the state vector data may be exchanged between different state machine engines 14 (e.g., chips) in a rank. The state vector data may be exchanged between the different state machine engines 14 for various purposes such as: to synchronize the state of the STEs 34, 36 of the FSM lattices 30 of the state machine engines 14, to perform the same functions across multiple state machine engines 14, to reproduce results across multiple state machine engines 14, to cascade results across multiple state machine engines 14, to store a history of states of the STEs 34, 36 used to analyze data that is cascaded through multiple state machine engines 14, and so forth. Furthermore, it should be noted that within a state machine engine 14, the state vector data may be used to quickly configure the STEs 34, 36 of the FSM lattice 30. For example, the state vector data may be used to restore the state of the STEs 34, 36 to an initialized state (e.g., to prepare for a new input data set), or to restore the state of the STEs 34, 36 to prior state (e.g., to continue searching of an interrupted or "split" input data set). In certain embodiments, the state vector data may be provided to the bus interface 130 so that the state vector data may be provided to the processor 12 (e.g., for analysis of the state vector data, reconfiguring the state vector data to apply modifications, reconfiguring the state vector data to improve efficiency of the STEs 34, 36, and so forth).

For example, in certain embodiments, the state machine engine 14 may provide cached state vector data (e.g., data stored by the state vector system 141) from the FSM lattice 30 to an external device. The external device may receive the state vector data, modify the state vector data, and provide the modified state vector data to the state machine engine 14 for configuring the FSM lattice 30. Accordingly, the external device may modify the state vector data so that the state machine engine 14 may skip states (e.g., jump around) as desired.

The state vector cache memory 142 may receive state vector data from any suitable device. For example, the state vector cache memory 142 may receive a state vector from the FSM lattice 30, another FSM lattice 30 (e.g., via the IR bus and process buffer interface 136), the de-compressor 138, and so forth. In the illustrated embodiment, the state vector cache memory 142 may receive state vectors from other devices via the state vector memory buffer 144.

Furthermore, the state vector cache memory 142 may provide state vector data to any suitable device. For example, the state vector cache memory 142 may provide state vector data to the state vector memory buffer 144, the state vector intermediate input buffer 146, and the state vector intermediate output buffer 148.

Additional buffers, such as the state vector memory buffer 144, state vector intermediate input buffer 146, and state vector intermediate output buffer 148, may be utilized in conjunction with the state vector cache memory 142 to accommodate rapid retrieval and storage of state vectors, while processing separate data sets with interleaved packets through the state machine engine 14. In the illustrated embodiment, each of the state vector memory buffer 144, the state vector intermediate input buffer 146, and the state vector intermediate output buffer 148 may be configured to temporarily store one state vector. The state vector memory buffer 144 may be used to receive state vector data from any suitable device and to provide state vector data to any suitable device. For example, the state vector memory buffer 144 may be used to receive a state vector from the FSM lattice 30, another FSM lattice 30 (e.g., via the IR bus and process buffer interface 136), the de-compressor 138, and the state vector cache memory 142. As another example, the state vector memory buffer 144 may be used to provide state vector data to the IR bus and process buffer interface 136 (e.g., for other FSM lattices 30), the compressor 140, and the state vector cache memory 142.

Likewise, the state vector intermediate input buffer 146 may be used to receive state vector data from any suitable device and to provide state vector data to any suitable device. For example, the state vector intermediate input buffer 146 may be used to receive a state vector from an FSM lattice 30 (e.g., via the IR bus and process buffer interface 136), the de-compressor 138, and the state vector cache memory 142. As another example, the state vector intermediate input buffer 146 may be used to provide a state vector to the FSM lattice 30. Furthermore, the state vector intermediate output buffer 148 may be used to receive a state vector from any suitable device and to provide a state vector to any suitable device. For example, the state vector intermediate output buffer 148 may be used to receive a state vector from the FSM lattice 30 and the state vector cache memory 142. As another example, the state vector intermediate output buffer 148 may be used to provide a state vector to an FSM lattice 30 (e.g., via the IR bus and process buffer interface 136) and the compressor 140.

Once a result of interest is produced by the FSM lattice 30, an event vector may be stored in a event vector memory 150, whereby, for example, the event vector indicates at least one search result (e.g., detection of a pattern of interest). The event vector can then be sent to an event buffer 152 for transmission over the bus interface 130 to the processor 12, for example. As previously described, the results may be compressed. The event vector memory 150 may include two memory elements, memory element A and memory element B, each of which contains the results obtained by processing the input data in the corresponding input buffers 132 (e.g., input buffer A and input buffer B). In one embodiment, each of the memory elements may be DRAM memory elements or any other suitable storage devices. In some embodiments, the memory elements may operate as initial buffers to buffer the event vectors received from the FSM lattice 30, along results bus 151. For example, memory element A may receive event vectors, generated by processing the input data from input buffer A, along results bus 151 from the FSM lattice 30. Similarly, memory element B may receive event vectors, generated by processing the input data from input buffer B, along results bus 151 from the FSM lattice 30.

In one embodiment, the event vectors provided to the results memory 150 may indicate that a final result has been found by the FSM lattice 30. For example, the event vectors may indicate that an entire pattern has been detected. Alternatively, the event vectors provided to the results memory 150 may indicate, for example, that a particular state of the FSM lattice 30 has been reached. For example, the event vectors provided to the results memory 150 may indicate that one state (i.e., one portion of a pattern search) has been reached, so that a next state may be initiated. In this way, the event vector 150 may store a variety of types of results.

In some embodiments, IR bus and process buffer interface 136 may provide data to multiple FSM lattices 30 for analysis. This data may be time multiplexed. For example, if there are eight FSM lattices 30, data for each of the eight FSM lattices 30 may be provided to all of eight IR bus and process buffer interfaces 136 that correspond to the eight FSM lattices 30. Each of the eight IR bus and process buffer interfaces 136 may receive an entire data set to be analyzed. Each of the eight IR bus and process buffer interfaces 136 may then select portions of the entire data set relevant to the FSM lattice 30 associated with the respective IR bus and process buffer interface 136. This relevant data for each of the eight FSM lattices 30 may then be provided from the respective IR bus and process buffer interfaces 136 to the respective FSM lattice 30 associated therewith.

The event vector 150 may operate to correlate each received result with a data input that generated the result. To accomplish this, a respective result indicator may be stored corresponding to, and in some embodiments, in conjunction with, each event vector received from the results bus 151. In one embodiment, the result indicators may be a single bit flag. In another embodiment, the result indicators may be a multiple bit flag. If the result indicators may include a multiple bit flag, the bit positions of the flag may indicate, for example, a count of the position of the input data stream that corresponds to the event vector, the lattice that the event vectors correspond to, a position in set of event vectors, or other identifying information. These results indicators may include one or more bits that identify each particular event vector and allow for proper grouping and transmission of event vectors, for example, to compressor 140. Moreover, the ability to identify particular event vectors by their respective results indicators may allow for selective output of desired event vectors from the event vector memory 150. For example, only particular event vectors generated by the FSM lattice 30 may be selectively latched as an output. These result indicators may allow for proper grouping and provision of results, for example, to compressor 140. Moreover, the ability to identify particular event vectors by their respective result indicators allow for selective output of desired event vectors from the result memory 150. Thus, only particular event vectors provided by the FSM lattice 30 may be selectively provided to compressor 140.

Additional registers and buffers may be provided in the state machine engine 14, as well. In one embodiment, for example, a buffer may store information related to more than one process whereas a register may store information related to a single process. For instance, the state machine engine 14 may include control and status registers 154. In addition, a program buffer system (e.g., restore buffers 156) may be provided for initializing the FSM lattice 30. For example, initial (e.g., starting) state vector data may be provided from the program buffer system to the FSM lattice 30 (e.g., via the de-compressor 138). The de-compressor 138 may be used to decompress configuration data (e.g., state vector data, routing switch data, STE 34, 36 states, Boolean function data, counter data, match MUX data) provided to program the FSM lattice 30.

Similarly, a repair map buffer system (e.g., save buffers 158) may also be provided for storage of data (e.g., save maps) for setup and usage. The data stored by the repair map buffer system may include data that corresponds to repaired hardware elements, such as data identifying which STEs 34, 36 were repaired. The repair map buffer system may receive data via any suitable manner. For example, data may be provided from a "fuse map" memory, which provides the mapping of repairs done on a device during final manufacturing testing, to the save buffers 158. As another example, the repair map buffer system may include data used to modify (e.g., customize) a standard programming file so that the standard programming file may operate in a FSM lattice 30 with a repaired architecture (e.g., bad STEs 34, 36 in a FSM lattice 30 may be bypassed so they are not used). The compressor 140 may be used to compress data provided to the save buffers 158 from the fuse map memory. As illustrated, the bus interface 130 may be used to provide data to the restore buffers 156 and to provide data from the save buffers 158. As will be appreciated, the data provided to the restore buffers 156 and/or provided from the save buffers 158 may be compressed. In some embodiments, data is provided to the bus interface 130 and/or received from the bus interface 130 via a device external to the state machine engine 14 (e.g., the processor 12, the memory 16, the compiler 20, and so forth). The device external to the state machine engine 14 may be configured to receive data provided from the save buffers 158, to store the data, to analyze the data, to modify the data, and/or to provide new or modified data to the restore buffers 156.

The state machine engine 14 includes a lattice programming and instruction control system 159 used to configure (e.g., program) the FSM lattice 30 as well as provide inserted instructions, as will be described in greater detail below. As illustrated, the lattice programming and instruction control system 159 may receive data (e.g., configuration instructions) from the instruction buffer 133. Furthermore, the lattice programming and instruction control system 159 may receive data (e.g., configuration data) from the restore buffers 156. The lattice programming and instruction control system 159 may use the configuration instructions and the configuration data to configure the FSM lattice 30 (e.g., to configure routing switches, STEs 34, 36, Boolean cells, counters, match MUX) and may use the inserted instructions to correct errors during the operation of the state machine engine 14. The lattice programming and instruction control system 159 may also use the de-compressor 138 to de-compress data and the compressor 140 to compress data (e.g., for data exchanged with the restore buffers 156 and the save buffers 158).

Figure 10:
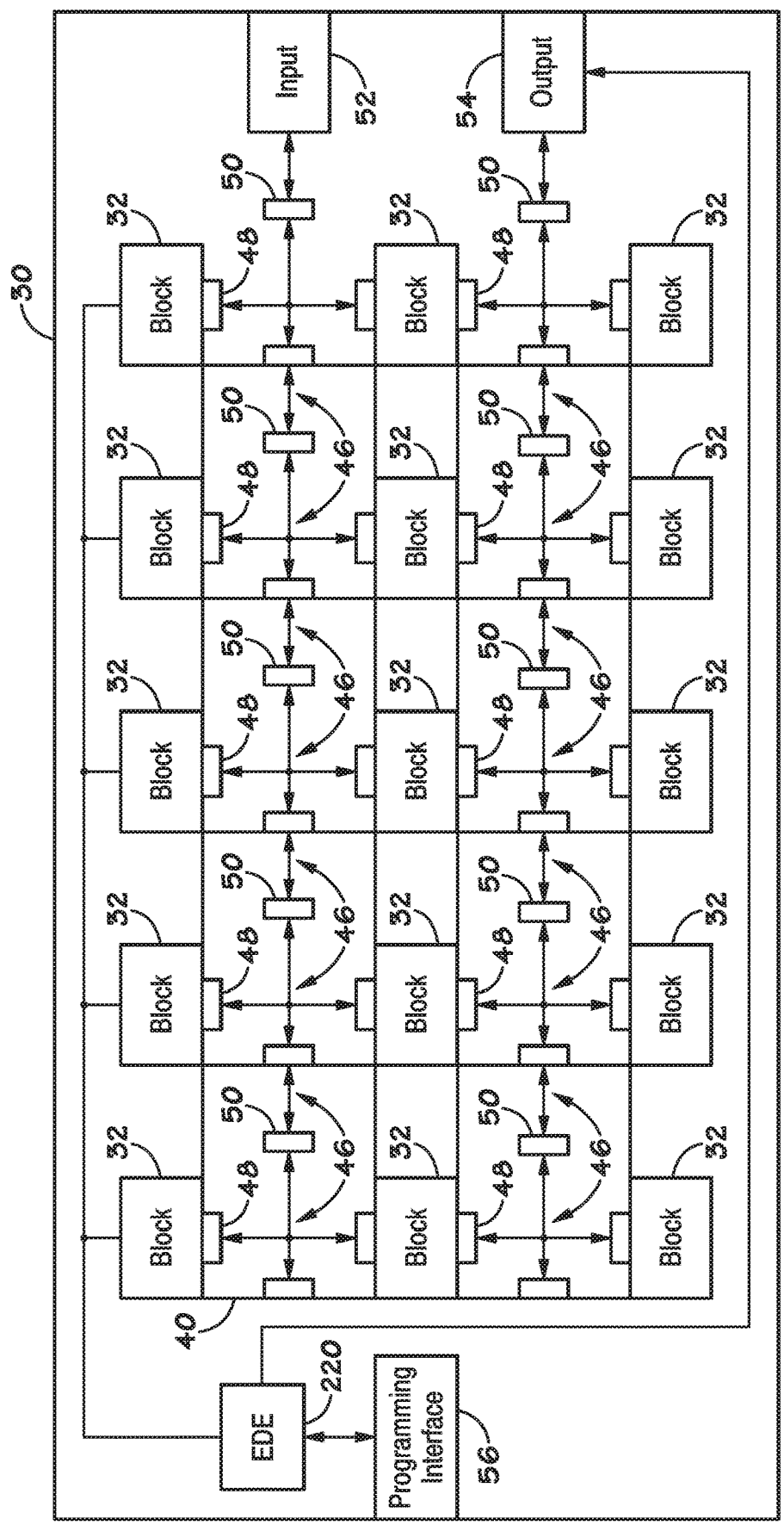
FIG. 10 illustrates a second example of an FSM lattice of the state machine engine of FIG. 1 including an error detection engine (EDE), according to various embodiments.

Returning to the FSM lattice 30, it should be noted that FIG. 10 illustrates the FSM lattice 30 including similar elements previously discussed with respect to FIG. 5 as well as an additional element, an error detection engine (EDE) 220. In some embodiments, the EDE 220 may perform just error detection or the EDE 220 may perform error detection and correction techniques. It should be understood that although a cyclic redundancy check (CRC) is described below as the technique used for error detection and correction, the present disclosure encompasses any and all techniques for error detection and correction. For example, it should be understood that the disclosed embodiments may include parity techniques, error correction code techniques, or the like, instead of or in addition to the CRC techniques described herein. The particular functionality and interconnection of these elements in the FSM lattice 30 will be discussed in greater detail with respect to FIG. 10.

The FSM lattice 30 in FIG. 10 includes the EDE 220 coupled to the programming interface 56, blocks 32, and the output 54. It should be noted that, although the EDE 220 is illustrated as being coupled to a subset of the blocks 32 for simplicity (e.g., top row of blocks 32), in practice the EDE 220 may be coupled to every block in the FSM lattice 30. In addition, although the EDE 220 is shown as part of the FSM lattice 30, in some embodiments, the EDE 220 may be located external to the FSM lattice 30 (while remaining internal to the state machine engine 14). Generally, the EDE 220 validates the configuration data of Symbol Response Memory (SRM), which may refer to the collective set of memory cells 80 in each state transition elements (STEs) 34, 36 of each GOT 60, as shown in greater detail below. However, it should be appreciated that, in some embodiments, the EDE 220 may perform validation of all blocks 32, per each individual block 32, per row 38, per individual GOT 60, per STE 34, 36, or some combination thereof. In some instances, one or more of the memory cells 80 in the blocks 32 of the FSM lattice 30 may experience data corruption, bit failure, or the like that causes the stored configuration data to be incorrect. As may be appreciated, for example, incorrect configuration data, which may be representative of a search pattern or regular expression to be used for that particular FSM lattice 30, may cause the FSM lattice 30 to produce erroneous results by missing the desired pattern (known as a false negative result) or by identifying an incorrect pattern (known as a false positive result) in a data string. Thus, using the disclosed integrity validating techniques may enable validating that the configuration data of the SRM is accurate. It should be noted that the integrity checking techniques may be performed from as high as the FSM lattice 30 level to as low as the block 32 level.

For example, in some embodiments, when configuration data (e.g., SRM information, such as high (1) or low (0) values) are received at the programming interface 56 and stored in the blocks 32, the configuration data is sent to the EDE 220. In some embodiments, the EDE 220 may calculate one or more initial CRC values based on the received configuration data at a first time and store the one or more CRC values in a memory, as described further below. In other embodiments, the one or more CRC values may be generated by the processor 12 and sent with the configuration data to the programming interface 56, which forwards the configuration data and/or CRC values to the EDE 220 for storage of the CRC values. Whenever the processor 12 initializes a validation of the configuration data of the SRM, the processor 12 may instruct the EDE 220 to read the SRM, perform one or more subsequent CRC value calculations, and compare the one or more subsequent CRC values to the one or more initial CRC values. If the CRC values are different, then the SRM may have been corrupted and the processor 12 may be notified via a signal output by the EDE 220 using the output 54. The signal may include an alert that the SRM includes incorrect configuration data (e.g., an error), the one or more initial CRC values, identification of the block 32 that includes the memory cell 80 with incorrect configuration data, and the like. In some embodiments, the EDE 220 may correct configuration data using the one or more initial CRC values or reprogram the SRM by sending configuration data to the programming interface 56.

The processor 12 may perform various corrective actions, such as using the one or more initial CRC values to attempt to correct the errors, retransmitting the one or more initial CRC values to the FSM lattice 30 and use them to attempt to correct the errors, reprogramming the SRM by sending the configuration data to store in the SRM to the programming interface 56, or some combination thereof. In some embodiments, when the processor 12 reprograms the SRM by sending configuration data (e.g., SRM information) to the programming interface 56 and the EDE 220 determines that the SRM still contains incorrect data, then the processor 12 may ignore (e.g., disable, leave unused, or the like) the block 32 that includes the problematic memory cells 80. Further, based on the information output by the EDE 220 indicating that reprogramming did not correct the configuration data of the SRM, the processor 12 may determine that the issue is related to hardware and display a message to the same effect.

Figure 11:
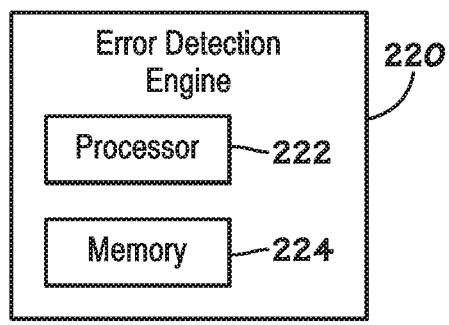
FIG. 11 illustrates example components of the EDE, according to various embodiments.

FIG. 11 illustrates example components of the error detection engine (EDE) 220, according to various embodiments. As depicted, the EDE 220 may include a processor 222, and a memory 224. The EDE 220 may be on a separate chip or included on the same chip as the FSM lattice 30 or the processor 12. In some embodiments, the EDE 220 may be implemented as computer instructions stored on the memory 224 and executed by the processor 222. The memory 224 may be any tangible, non-transitory medium configured to store data (e.g., one or more CRC values), computer instructions, or the like. For example, the memory 224 may store computer instructions that, when executed by the processor 222, cause the processor 222 to calculate CRC values for the SRM configuration data, store the one or more CRC values, retrieve the one or more CRC values, compare initial and subsequent CRC values, and/or output a signal based on the results of the comparison, among other things.

CRC may detect for errors in raw data by calculating an error detection/correction code for blocks of data entering a system. For example, when SRM configuration data is input into the programming interface 56 from the processor 12, the CRC value may be calculated by the EDE 220. In some embodiments, as noted above, the processor 12 may compute the one or more CRC values and send them with the SRM configuration data to the programming interface 56. In such an instance, the one or more CRC values may be sent to the EDE 220 via the programming interface 56 and the SRM configuration data may not be sent to the EDE 220. In some embodiments, the one or more CRC values may be a remainder of a polynomial division and have a fixed length (e.g., 2, 3, 4 bits). Additionally, the one or more CRC values may include a binary sequence. For example, a 3-bit CRC value of "100" may result as the remainder after the EDE 220 performs polynomial division on the SRM configuration data when initially input to the SRM. If the processor 12 wants to validate the integrity of the SRM configuration data at a later time, the EDE 220 may retrieve the SRM configuration data and repeat the calculation of the CRC value. If the subsequently calculated CRC value does not equal "100," then there may be an error with the SRM configuration data. If a difference is detected between the initial one or more CRC values and the one or more subsequent CRC values, then the EDE 220 may output a signal indicative of the difference to the processor 12 via the output 54 of the FSM lattice 30. Additionally or alternatively, if a difference is detected between the initial one or more CRC values and the one or more subsequent CRC values, the processor 222 may attempt to correct the configuration data using the initial CRC values, to reprogram the SRM by sending the SRM configuration data to the programming interface 56, or the like.

Figure 12:
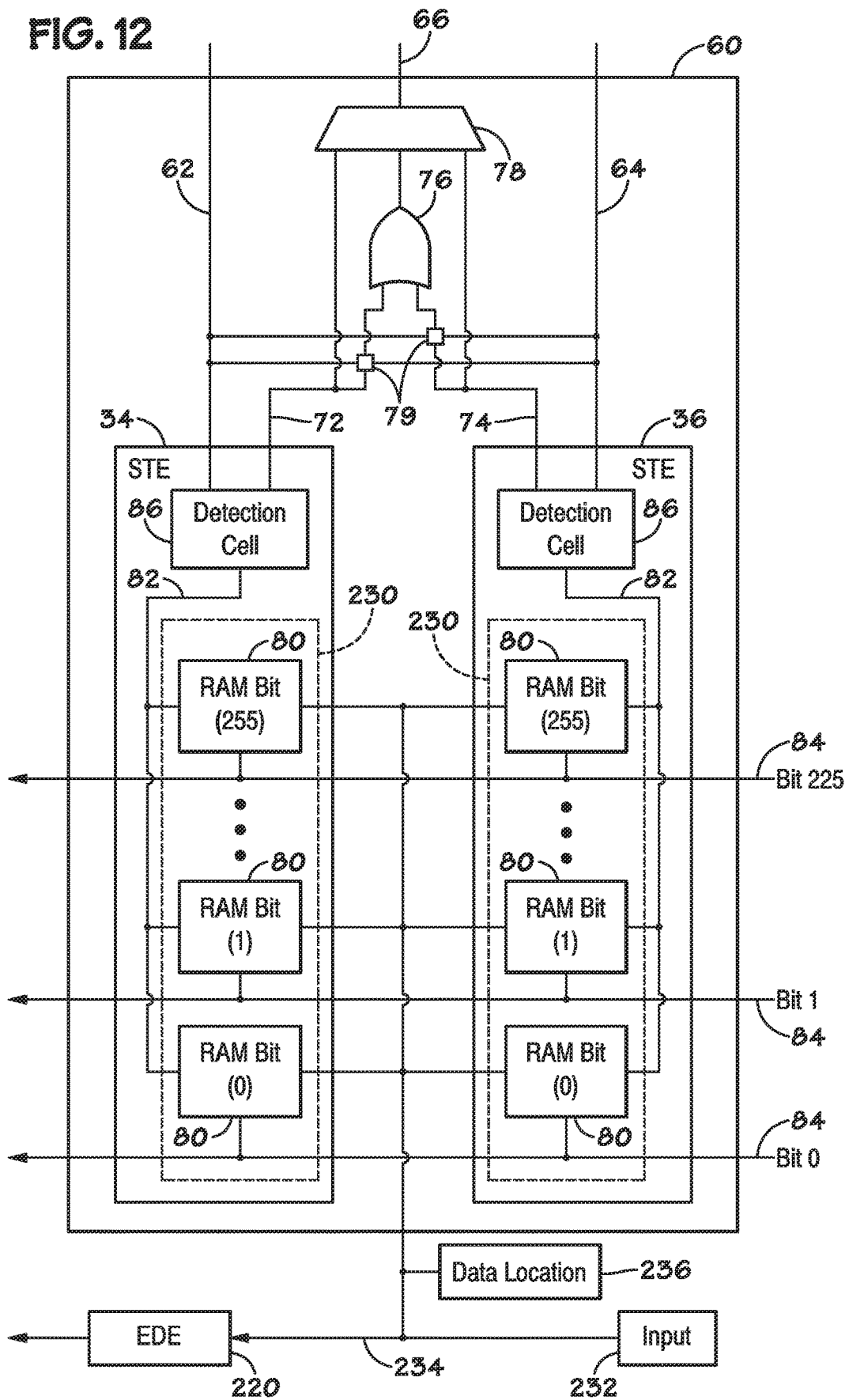
FIG. 12 illustrates an example of a Group of Two of a row of a block of FIG. 4 including Symbol Response Memory, according to embodiments.
Figure 15:
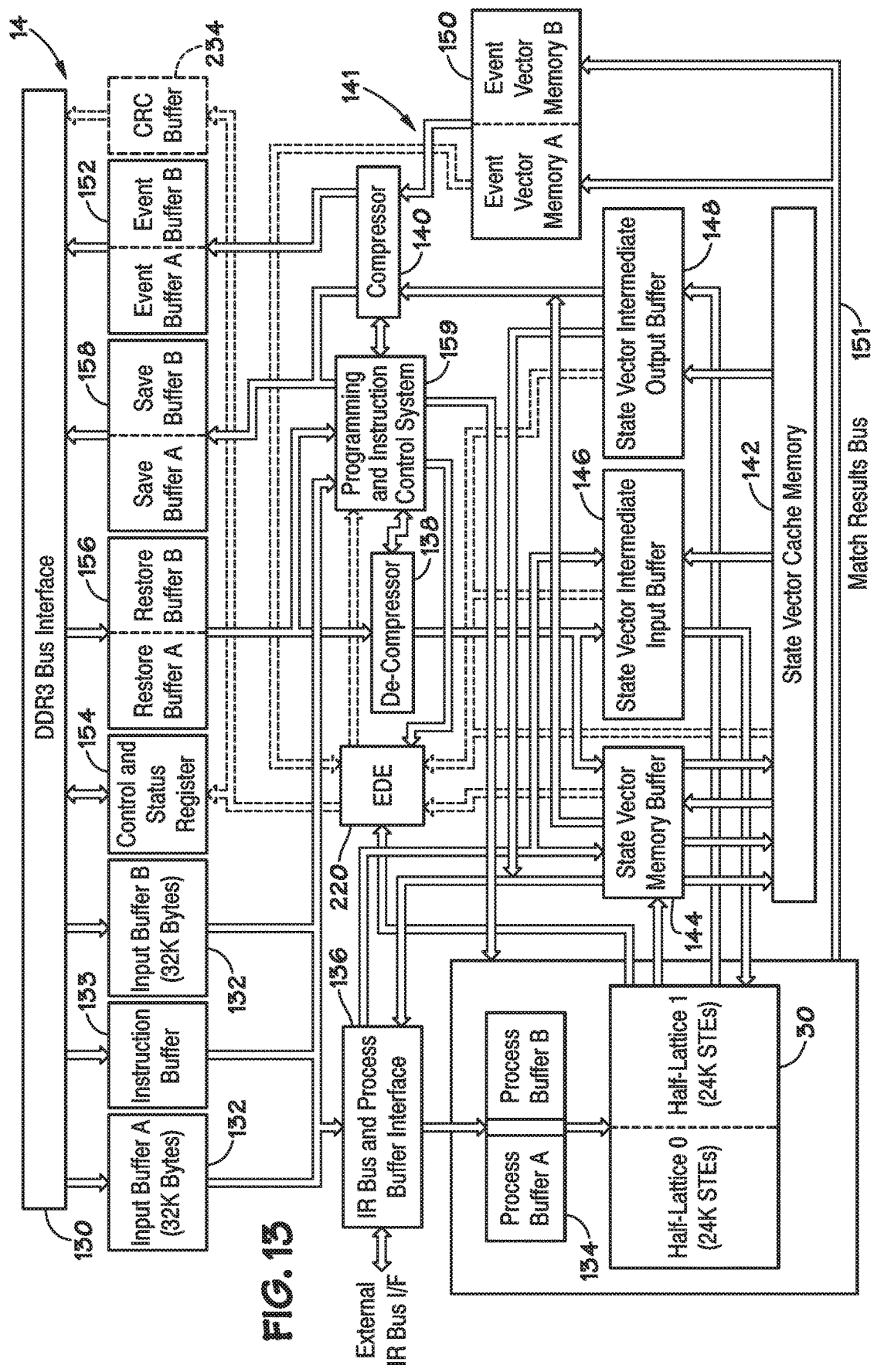

To further illustrate some of the data integrity validation embodiments disclosed herein, FIG. 12 illustrates an example of a Group of Two (GOT) 60 of a row 38 in a block 32 of FIG. 4 including Symbol Response Memory (SRM) 230, according to embodiments. Accordingly, FIG. 12 includes similar elements previously discussed with respect to FIG. 4 as well as the EDE 220, an input 232, and a data location 236. As depicted, each STE 34, 36 may include a respective SRM 230, and each SRM 230 may include the collective memory cells 80 of the respective STE 34. For example, each SRM 230 may include 256 memory cells 80. Also, as previously discussed, each memory cell 80 can be set to a high or low value by reading bits from an associated register. Accordingly, the STEs 34, 36 can be configured by storing an image created by the compiler 20 into the registers and loading the bits in the registers into associated memory cells 80. In an example, the image created by the compiler 20 includes a binary image of high and low (e.g., 1 and 0) bits, also referred to as SRM configuration data herein. The SRM configuration data may be received via input 232 from the programming interface 56.

As depicted, the input 232 is connected to each memory cell 80 via data line 234 so the appropriate value may be stored in each memory cell 80 when the SRM configuration data is received from the processor 12. In addition, as depicted, the input 232 is connected to the EDE 220 via the data line 234 so the SRM configuration data may be sent to the EDE 220 when received to enable the EDE 220 to calculate the initial one or more CRC values for the SRM configuration data and/or send the SRM configuration data to the programming interface 56. When the EDE 220 calculates the initial one or more CRC values, the EDE 220 may calculate the CRC value for the configuration data of each SRM 230. For example, the configuration data for one SRM 230 in the STE 34 may include a binary sequence of 256 bits and the EDE 220 may calculate a corresponding CRC value of n-bits (e.g., 2-, 3-, 4-, 5-, 6-, 7-, 8-, 9-, 10-bit, etc.). Further, in some embodiments, the CRC value may be calculated for the SRM configuration data of both SRMs 230 combined for the STEs 34, 36. However, in some embodiments, the data provided to the input 232 may include the one or more CRC values that are calculated by the processor 12, in addition to the SRM configuration data. In such an instance, the input 232 may send the SRM configuration data to be stored in the appropriate memory cells 80 and the one or more CRC values to the EDE 220.

The EDE 220 may store the one or more CRC values in the memory 224, as previously discussed. It should be understood that there may be numerous CRC values because there may be numerous SRMs 230 in each GOT 60 included in each block 32 and one or more CRC value may be calculated for the configuration data of each SRM 230. As previously discussed, in some embodiments, there may be one CRC value calculated for all memory cells 80 included in all SRMs 230 of the FSM lattice 30 (e.g., for all blocks 32), one CRC value calculated for a particular block 32, one CRC value calculated for a particular GOT 60, one CRC value calculated for a particular STE 34, 36, or the like.

It should be noted that the data line 234 may be bi-directional in that the EDE 220 may request SRM configuration data from the memory cells 80 of the SRMs 230 and the memory cells 80 may output its stored values to the EDE 220 via the data line 234. Thus, data may be sent into the memory cells 80 from the input 232 via the data line 234 and data may be read out of the memory cells 80 by the EDE 220 via the data line 234. In some embodiments, the EDE 220 may request SRM configuration data from the SRMs 230 when the processor 12 issues an instruction to verify the integrity of the SRM configuration data. The instruction from the processor 12 may be received via the input 232 (e.g., from the programming interface 56) and sent to the EDE 220. It should be noted that the input 232 may receive data such as the SRM configuration data that is used to program the memory cells 80 of the SRMs 230, which is different than the data to be analyzed that is received by the input 52 of the FSM lattice 30 and processed by the memory cells 80 via the one or more selected data stream lines 84.

Upon receipt of the instruction to validate the SRM configuration data integrity, the EDE 220 may compute subsequent CRC values by retrieving the SRM configuration data from the SRMs 230 and compare the initial CRC values stored in its memory 224 and the subsequent CRC values to determine whether there is an error. If an error is detected, the EDE 220 may output a signal indicative of the same. If no error is detected, the EDE 220 may output a signal indicative of the same.

In addition, as depicted, the data location 236 is connected to the data line 234 and, in some embodiments, the integrity validation techniques performed by the EDE 220 may be performed on configuration data stored in the data location 236. It should be noted that the data location 236 may be located on the same chip but external to the GOTs 60 including the SRM 230. That is, the integrity validation techniques may be performed using configuration data stored separately from the SRM 230. In some embodiments, the data location 236 may include flip-flop registers on the chip, RAM vectors (e.g., state vector memory buffer 144, state vector cache memory 142, state vector intermediate input buffer 146, state vector intermediate output buffer 148, event vector memory 150), or the like. The EDE 220 may perform the validation techniques disclosed herein on any suitable configuration data stored in the data location 236.

FIG. 13 illustrates an example of the state machine engine 14 of FIG. 9 including the EDE 220, according to various embodiments. Accordingly, FIG. 13 includes many elements similar to those of FIG. 9, as well as the EDE 220 and a CRC buffer 234 (optional). In the depicted embodiment, the EDE 220 may be located within the state machine engine 14 (e.g., on its own chip or on the same physical chip) and not part of the FSM lattice 30.

As previously discussed, the state machine engine 14 includes the lattice programming and instruction control system 159 used to configure (e.g., program) the FSM lattice 30 as well as provide inserted instructions. As illustrated, the lattice programming and instruction control system 159 may receive data (e.g., configuration instructions) from the instruction buffer 133. Furthermore, the lattice programming and instruction control system 159 may receive data (e.g., configuration data) from the restore buffers 156 and/or the EDE 220. The lattice programming and instruction control system 159 may use the configuration instructions and the configuration data to configure the FSM lattice 30 (e.g., to configure routing switches, STEs 34, 36, Boolean cells, counters, match MUX) and may use the inserted instructions to correct errors during the operation of the state machine engine 14. For example, the processor 12 may send instructions to correct an error in one or more of the SRMs 230 when the EDE 220 determines that an error is present. Additionally or alternatively, the processor 222 of the EDE 220 may send the SRM configuration data to the programming and instruction control system 159 without contacting the host 12 when the processor 222 detects a difference between one or more initial CRC values and one or more subsequent CRC values. Another example instruction stored in the instruction buffer 133 may include an instruction from the processor 12 to the state machine engine 14 to validate the integrity of the configuration data in the SRMs 230.

As depicted, the programming and instruction control system 159 is connected to the EDE 220 to provide the SRM configuration data, one or more initial CRC values associated with the SRM configuration data, and/or the instruction to validate the integrity of the SRM configuration data. Thus, anytime the FSM lattice 30 is programmed with SRM configuration data, the programming and instruction control system 159 may receive the SRM configuration data and send it to both the EDE 220 and the FSM lattice 30. Further, the programming and instruction control system 159 may receive SRM configuration data from the EDE 220. The EDE 220 may receive the SRM configuration data and calculate the one or more initial CRC values at a first time, as discussed above. Further, the EDE 220 may store the one or more initial CRC values and the SRM configuration data in its memory 224. In some embodiments, when the one or more CRC values are calculated by the processor 12 for the SRM configuration data and sent from the programming and instruction control system 159, the EDE 220 may receive the one or more initial CRC values and store them in its memory 224.

When the processor 12 issues the instruction to validate the integrity of the SRMs 230, the programming and instruction control system 159 sends the instruction to perform the SRM integrity validation to the EDE 220. The EDE 220 may request the STE 34 to provide the state (e.g., configuration data) of the memory cells 80 of each GOT 60 in each data block 32 included in each FSM lattice 30 at a second time (e.g., subsequent to the first time). As previously discussed, the state may include either a high or a low value. The STE 34 may send a binary sequence of bits to the EDE 220 that includes 256 bits from each SRM 230 in each GOT 60 or the binary sequence of bits may include bits from the entire core of data blocks 32 of the FSM lattice 30. Thus, in some embodiments, the data verification may be performed at the block 32 level or the core level. The EDE 220 repeats the CRC value calculation when the SRM configuration data is received from the STE 34 to obtain one or more subsequent CRC values.

The EDE 220 performs the SRM data integrity validation by comparing the one or more subsequent CRC values to the one or more initial CRC values stored in the memory 224. If any of the CRC values do not match, then the EDE 220 output a signal indicating there is an error in the SRM configuration data. The signal may include the result that there is an error, the one or more initial CRC values, the identity of the GOT 60 and/or block 32 that includes the erroneous data, and the like. In some embodiments, the EDE 220 may attempt to resolve the error itself by using the initial one or more CRC values to fix the erroneous SRM configuration data and send the corrected SRM configuration data to the programming and instruction control system 159 or, alternatively, send the originally received SRM configuration data to the programming and instruction control system 159.

If the CRC values match, then the EDE 220 outputs a result indicating that there is not an error in the SRM configuration data. As depicted, the EDE 220 may be connected to the control and status register 154 and/or to the CRC buffer 234. In embodiments where the CRC buffer 234 is not present, the EDE 220 may send the result, initial CRC values, and/or GOT 60 and/or block 32 identity to the control and status register 154. The data may be delivered by the control and status register 154 to the DDR3 bus interface 130, which delivers the result to the processor 12. Additionally or alternatively, the data may be stored in the control and status register 154 until the processor 12 reads the data in the register 154.

In some embodiments, the CRC buffer 224 may be used to store the data (e.g., result, initial CRC values, GOT 60 and/or block 32 identity) output by the EDE 220. The data may be delivered by the CRC buffer 234 to the DDR3 bus interface 130, which delivers the result to the processor 12. Additionally or alternatively, the data may be stored in the CRC buffer 234 until the processor 12 reads the data in the register 154. If the processor 12 receives a result that indicates there is an error present in the SRM 230, then the processor 12 may perform one or more corrective actions, as described in more detail below.

Additionally, in some embodiments, the EDE 220 may validate the integrity of any suitable configuration data stored in other components of the state machine engine 14, such as the data location(s) 236 (e.g., RAM-based vectors (state vector memory buffer 144, state vector cache memory 142, state vector intermediate input buffer 146, state vector intermediate output buffer 148, event vector memory 150), flip-flop registers, and the like), as described above. Thus, it should be borne in mind that, although the discussion of the disclosed integrity validation techniques focuses on configuration data stored in the SRM 230, embodiments may include performing the techniques using any suitable component (e.g., data location 236) that stores configuration data. For example, a routing matrix may be controlled by signals that originate in registers on the chip that are programmed by the host processor 12. These registers may benefit from the use of the disclosed integrity validation techniques. In another example, in some embodiments, the state vector cache memory 142 may include configuration data indicative of statuses of the configurable elements (e.g., STEs 34 and 36) at any given point in time. The EDE 220 may read the configuration data stored in the state vector cache memory 142 and validate whether the configuration data is valid or corrupt. Additionally, in some embodiments, the EDE 220 may read the configuration data directly from the FSM lattice 30 to determine whether the configuration data currently in use by the FSM lattice 30 is valid or corrupt.

Figure 14:
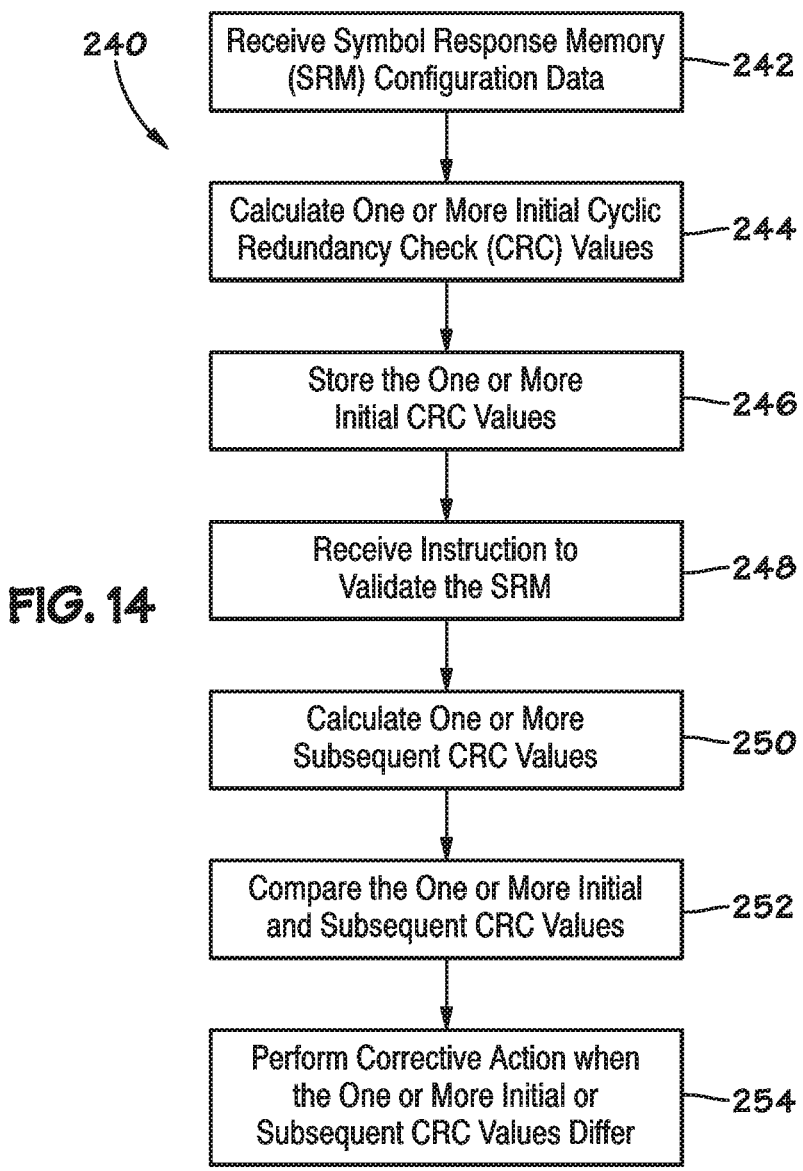
FIG. 14 illustrates a flow chart of a method for validating the configuration contents of the Symbol Response Memory, according to various embodiments.

FIG. 14 illustrates a flow chart of a method 240 for validating the configuration data of the Symbol Response Memory (SRM) 230, according to various embodiments. Although the following description of the method 240 is described with reference to the processor 222 of the EDE 220, it should be noted that the method 240 may be performed by other processors that may be capable of communicating with the EDE 220, such as the processor 12. Additionally, although the following method 240 describes a number of operations that may be performed, it should be noted that the method 240 may be performed in a variety of suitable orders and all of the operations may not be performed. It should be appreciated that the method 240 may be wholly executed by the EDE 220 or the execution may be distributed between the EDE 220 and the processor 12. In some embodiments, the method 240 may be implemented as computer instructions stored on the memory 224 and executed by the processor 222. Additionally or alternatively, the method 240 may partially or wholly implemented in hardware components.

Referring now to the method 240, the processor 222 may receive (block 242) SRM configuration data. As previously discussed, the SRM configuration data may be received from the programming interface 56 or the input 232 when the EDE 220 is included in the FSM lattice 30 and the SRM configuration data may be received from the programming and instruction control system 159 when the EDE 220 is included in the finite state machine 14. The SRM configuration data may include a binary bit sequence with a high or low value to set each of the memory cells 80 in the SRMs 230 of the GOTs 60 included in the data blocks 32. It should be noted that, in some embodiments, the processor 222 of the EDE 220 may receive the one or more initial CRC values instead of or in addition to receiving the SRM configuration data.

The processor 222 may calculate (block 244) one or more initial CRC values based on the received SRM configuration data in embodiments where the EDE 220 just receives the SRM configuration data. As previously discussed, the processor 222 may perform polynomial division on the SRM configuration data (e.g., binary bit sequence) to obtain the one or more initial CRC values based on the remainder. The processor 222 may store (block 246) the one or more initial CRC values in the memory 224 to be compared against later. At any time during operation, the host processor 12 may desire to validate the configuration data stored in the memory cells 80 of the SRM 230. Accordingly, the host processor 12 may issue an instruction to the EDE 220 to validate the integrity of the configuration data of the SRM 230. The processor 222 may receive (block 248) the instruction and calculate (block 250) one or more subsequent CRC values.

In embodiments where the EDE 220 is part of the FSM lattice 30, the EDE 220 may directly read the memory cells 80 of each of the GOTs 60 of the blocks 32 to retrieve the SRM configuration data. In embodiments where the EDE 220 is not part of the FSM lattice 30, the EDE 220 may retrieve the SRM configuration data from one or more vectors (e.g., the state vector memory buffer 144, state vector cache memory 142, the state vector intermediate input buffer 146, the state vector intermediate output buffer 148, and/or the event vector memory 150). Once the processor 222 retrieves the SRM configuration data, the processor 222 may repeat the CRC value calculation on the retrieved SRM configuration data to obtain the one or more subsequent CRC values. Next, the processor 222 may retrieve the one or more initial CRC values from the memory 224 and compare (block 252) the one or more initial CRC values and the one or more subsequent CRC values.

If there is a difference between the one or more initial CRC values and the one or more subsequent CRC values, the processor 222 may perform (block 254) a corrective action. For example, the processor may output a signal that includes information (e.g., one or more initial CRC values, identity of the memory cell 80, the GOT 60, and/or the block 32 that includes the erroneous SRM configuration data, etc.) to the host processor 12. The host processor 12 may receive the signal and determine an appropriate action to take to attempt to correct the error. For example, the host processor 12 may use the one or more initial CRC values received from the EDE 220 to attempt to correct the error. In some embodiments, the processor 12 may modify SRM configuration data using the one or more initial CRC values (e.g., multiplying the SRM configuration data by the CRC value) to attempt to fix SRM configuration data in the one or more blocks 32 that include erroneous configuration data. In another example, when the host processor 12 calculates the one or more initial CRC values, the processor 12 may retransmit the initial CRC values and use them to attempt to correct the errors. Further, in some embodiments, the host processor 12 may reprogram the SRMs 230 by retransmitting the SRM configuration data to the programming interface 56 and/or the programming and instruction control system 159. After the SRMs 230 are reprogrammed, the integrity validation techniques may be performed again. If the SRM configuration data for certain blocks 32 is still erroneous, then the processor 12 may ignore those blocks 32 during operation. In such a scenario, the processor 12 may cause an alert to be sent or displayed that indicates that reprogramming was not successful and that there is a potential hardware issue.

In some embodiments, when the EDE 220 is disposed in the FSM lattice 30 and an error in the SRM configuration data is detected, the EDE 220 may directly write to the memory cells 80 of each of the GOTs 60 of the blocks 32 that include errors to reprogram the memory cells 80 with the original SRM configuration data without contacting the host processor 12. In some embodiments, the EDE 220 may directly reprogram all of the memory cells 80 with the original SRM configuration data (e.g., by multiplying the SRM configuration data by the initial CRC value) without contacting the host processor 12. If the EDE 220 performs a subsequent SRM configuration data validity check and determines that the initial and subsequent one or more CRC values match, then the EDE 220 will be deemed to have fixed the SRM configuration data error(s) and the state machine 14 may continue to process with the current SRM configuration data. However, in some embodiments, if a subsequent error is detected in the SRM configuration data after reprogramming the memory cells 80, then the EDE 220 may notify the host processor 12 of the failure to fix certain memory cells 80 and instruct the host processor 12 to ignore the faulty memory cells 80. Alternatively, if a subsequent error is detected in the SRM configuration data after reprogramming the memory cells 80, then the EDE 220 may output a signal to the host processor 12 as described above, and the processor 12 may perform a corrective action.

For example, the host processor 12 may attempt to fix the SRM configuration data as described above. If the host processor 12 performs a corrective action and a subsequent SRM configuration data validity check by the EDE 220 indicates the configuration data is accurate (e.g., the one or more initial and subsequent CRC values match), then the state machine 14 may continue to process with the current SRM configuration data. However, if a subsequent error is detected in the SRM configuration data after the host processor 12 performs the corrective action, then the processor 12 may ignore those blocks 32 that contain the faulty SRM configuration data during operation.

In some embodiments, when the EDE 220 is not included in the FSM lattice 30 (for example, when the EDE 220 is external to the FSM 30 as illustrated in FIG. 13) and an error in the configuration data is detected, the EDE 220 may send the original SRM configuration data to the programming and instruction control system 159 to attempt to fix the erroneous data without contacting the host processor 12. The programming and instruction control system 159 may send the SRM configuration data to the FSM lattice 30 to reprogram the problematic memory cells 80 or reprogram all memory cells 80. If the EDE 220 performs a subsequent SRM configuration data validity check and determines that the initial and subsequent one or more CRC values match, then the SRM configuration data error is deemed to be fixed, and the state machine 14 may continue to process with the current SRM configuration data. However, in some embodiments, if a subsequent error is detected in the SRM configuration data after reprogramming the memory cells 80, then the EDE 220 may notify the host processor 12 of the failure to fix certain memory cells 80 and instruct the host processor 12 to ignore the faulty memory cells 80. Alternatively, if a subsequent error is detected in the SRM configuration data after reprogramming the memory cells 80, then the EDE 220 may output a signal to the host processor 12 as described above, and the processor 12 may perform a corrective action similar to that described above in conjunction with the embodiment in which the EDE 220 is disposed in the FSM lattice 30.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system, comprising:
    a host processor configured to initiate transmission of data to be analyzed; and
    a state machine engine coupled to the host processor and configured to receive the data to be analyzed, wherein the state machine engine comprises:
        a plurality of blocks, wherein each block of the plurality of blocks comprises a plurality of rows, wherein each row of the plurality of rows comprises a plurality of configurable elements, wherein each configurable element of the plurality of configurable elements comprises a data analysis element comprising a memory component programmed with configuration data, wherein the data analysis element is configured to analyze at least a portion of the data based on the configuration data and to output a result; and
        an error detection engine (EDE) configured to perform integrity validation of the configuration data.

2. The system of claim 1, wherein the EDE is configured to utilize one or more cyclic redundancy checks (CRC) to perform the integrity validation of the configuration data.

3. The system of claim 2, wherein the EDE comprises a processor configured to calculate one or more initial CRC values based on the configuration data.

4. The system of claim 3, wherein the EDE comprises a memory configured to store the one or more initial CRC values.

5. The system of claim 4, wherein the EDE is configured to compare the one or more initial CRC values against one or more additionally calculated CRC values and output a signal when the one or more additionally calculated CRC values differ from the one or more initial CRC values.

6. The system of claim 2, wherein state machine engine is configured to receive one or more initial CRC values calculated based on the configuration data.

7. The system of claim 6, wherein the EDE comprises a memory configured to store the one or more initial CRC values.

8. The system of claim 7, wherein the EDE is configured to compare the one or more initial CRC values against one or more additionally calculated CRC values and output a signal when the one or more additionally calculated CRC values differ from the one or more initial CRC values.

9. The system of claim 8, wherein the state machine engine is configured to receive retransmitted instructions to reprogram the memory component of the data analysis element of each of the plurality of configuration elements with the configuration data subsequent to output of the signal.

10. The system of claim 1, wherein the EDE is configured to perform the integrity validation at a block level comprising at least one block of the plurality of blocks, at a core level including the plurality of blocks, or both.

11. The system of claim 1, wherein the memory component comprises a symbol response memory (SRM) including a plurality of memory cells that each store a high value or a low value based on the configuration data.

12. A system, comprising:
a host processor configured to initiate transmission of data to be analyzed;
a memory coupled to the host processor and configured to store the data to be analyzed; and
a state machine engine coupled to the host processor and to the memory, wherein the state machine engine is configured to:
receive the data to be analyzed from the memory; and
transmit a result of an analysis of the data by the state machine engine to the host processor, wherein the state machine engine comprises:
a plurality of configurable elements, wherein each configurable element of the plurality of configurable elements is configured to be programmed via configuration data and to selectively output a result as a portion of the result of the analysis; and
an error detection engine (EDE) configured to validate an integrity of the configuration data.

13. The system of claim 12, wherein the state machine engine comprises a finite state machine lattice, wherein the finite state machine lattice comprises the plurality of configurable elements and the EDE.

14. The system of claim 13, wherein the finite state machine lattice comprises a programming interface configured to:
program each of the plurality of configurable elements with the configuration data; and
send the configuration data to the EDE to calculate one or more initial cyclic redundancy check (CRC) values based on the configuration data each time the configuration data is received.

15. The system of claim 12, wherein the EDE is configured to utilize a cyclic redundancy check (CRC) to at least partially validate the integrity of the configuration data by receiving the configuration data, calculating one or more initial CRC values based on the configuration data, receiving a request to validate the integrity of the configuration data, calculating one or more subsequent CRC values based on configuration data retrieved at a later time, and determining whether the one or more initial CRC values differ from the one or more subsequent CRC values.

16. The system of claim 15, wherein the EDE is configured to output a signal indicative of an error in the configuration data when the one or more initial CRC values differ from the one or more subsequent CRC values.

17. The system of claim 12, wherein the EDE is configured to at least partially validate the integrity of the configuration data by:
receiving one or more initial cyclic redundancy check (CRC) values;
receiving an instruction to validate the integrity of the configuration data;
calculating one or more subsequent CRC values based on configuration data retrieved at a later time; and
determining whether the one or more initial CRC values differs from the one or more subsequent CRC values.

18. The system of claim 12, wherein the EDE is configured to at least partially validate the integrity of the configuration data by determining whether an initial cyclic redundancy check (CRC) value generated based on the configuration data at a first time differs from a subsequent CRC value generated at a second time.

19. A system, comprising:
a host processor configured to initiate transmission of data to be analyzed; and
a state machine engine coupled to the host processor and configured to receive the data to be analyzed, wherein the state machine engine comprises:
a finite state machine lattice comprising:
a plurality of blocks, each block of the plurality of blocks comprising:
a plurality of rows, each row of the plurality of rows comprising:
a plurality of configurable elements, wherein each configurable element of the plurality of configurable elements comprises a memory programmed with configuration data to selectively set a data state of the as one of a high state or a low state, wherein the data state is utilized in an analysis of at least a portion of the data stream; and
an error detection engine (EDE) configured to at least partially validate an integrity of the configuration data by determining whether an initial cyclic redundancy check (CRC) value generated based on the configuration data at a first time differs from a subsequent CRC value generated at a second time.

20. The system of claim 19, wherein the EDE is configured to output a signal indicative of an error when the initial CRC value differs from the subsequent CRC value, wherein the state machine engine is configured to receive instructions to reprogram each of the plurality of configurable elements subsequent to output of the signal.

* * * * *